United States Patent [19]
Katsumata et al.

[11] Patent Number: 4,736,189
[45] Date of Patent: Apr. 5, 1988

[54] METHOD AND APPARATUS FOR CALIBRATING AN ANALOG-TO-DIGITAL CONVERSION APPARATUS

[75] Inventors: Hiromi Katsumata, Shizuoka; Rikichi Murooka, Chiba; Takeko Yumoto, Tokyo, all of Japan

[73] Assignee: Sony/Tektronix Corporation, Tokyo, Japan

[21] Appl. No.: 916,607

[22] Filed: Oct. 8, 1986

[30] Foreign Application Priority Data
Dec. 24, 1985 [JP] Japan .................. 60-291010

[51] Int. Cl.⁴ ............................. H03M 1/10
[52] U.S. Cl. ................. 340/347 CC; 340/347 AD
[58] Field of Search .............. 340/347 AD, 347 CC

[56] References Cited
U.S. PATENT DOCUMENTS
4,345,241  8/1982  Takeuchi ............... 340/347 CC Primary Examiner—Charles D. Miller
Attorney, Agent, or Firm—Dellett, Smith-Hill and Bedell

[57] ABSTRACT

The phase relation of clock signals to be applied to an interleave type analog-to-digital conversion apparatus having N analog-to-digital converters is calibrated by applying a repetitive reference signal to the N analog-to-digital converters. The digital values from the N analog-to-digital converters are selected at corresponding sampling points of successive cycles of the reference signal. The clock phase relation is adjusted such that the selected digital values are made substantially equal to each other.

18 Claims, 15 Drawing Sheets

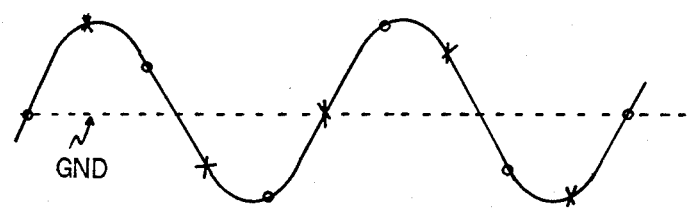
F I G. 17
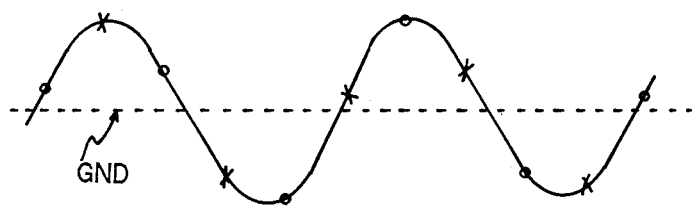
F I G. 18
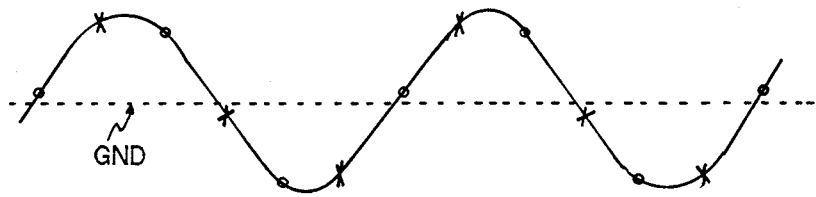
F I G. 19

and the A/D converter 14 samples the ramp waveform 26 and converts the sample values into digital values at the times $t_n$, $t_{n+2}$ … as shown in FIG. 2. Under ideal conditions, digital values $d_{n-1}$, $d_n$, $d_{n+1}$, $d_{n+2}$ … will be obtained. However, in practice, the analog input signal is not sampled and converted into digital form at a constant period because of characteristic differences in the characteristics of the A/D converters (e.g., propagation delay time), phase shift errors in the clock signals, differences in propagation delay times of the input stages for the A/D converters, or a combination of these phenomena. These errors have the effect of shifting the times $t_n$, $t_{n+2}$ … to times $t'_n$, $t'_{n+2}$ … so that the digital values $d_n$, $d_{n+2}$ … are shifted to $d'_n$, $d'_{n+2}$ …. Thus, the use of multiple A/D converters to accommodate a high frequency input signal introduces errors into the A/D conversion apparatus.

METHOD AND APPARATUS FOR CALIBRATING AN ANALOG-TO-DIGITAL CONVERSION APPARATUS

BACKGROUND OF THE INVENTION

The present invention relates to a method and an apparatus for calibrating an analog-to-digital conversion (hereinafter A/D) apparatus, especially to a method and apparatus for calibrating the phase relationship between clock signals to be applied to a plurality of A/D converters that receive a common analog signal.

It is common to use digital techniques for processing an analog input signal. The analog signal is converted to digital form using an A/D conversion apparatus that samples the analog signal and quantizes it. In order to avoid aliasing, the sampling frequency must be at least twice the frequency of the highest frequency component present in the analog signal. Therefore, in order to enable a high frequency analog signal to be processed using digital technique, it is necessary to employ an A/D conversion apparatus that is responsive to a high sampling frequency. Conventional A/D conversion apparatus that employs a single A/D converter is not able to sample the analog input signal at a sufficiently high frequency for all applications. Therefore, it is conventional for a high speed A/D conversion apparatus to use the so-called interleave technique, wherein the analog input signal is applied to N (integer larger than one) A/D converters and N-phase clock signals are applied to the A/D converters respectively so that the A/D converters operate sequentially. This enables the effective sampling frequency to be increased substantially.

FIG. 1 shows a block diagram of a conventional interleave A/D conversion apparatus. In FIG. 1, the analog input signal is applied through an input terminal 10 to N A/D converters 12 and 14 (in this case, N=2). Each of these A/D converters may be a parallel comparison type A/D converter or a serial-parallel type A/D converter (composed of a parallel comparison type A/D converter, a digital-to-analog converter and a differential amplifier). A clock generator 16 generates two-phase clock signals that are 180 degrees out-of-phase. The A/D converters 12 and 14 convert the analog input signal into two digital signals in response to the two-phase clock signals respectively. Sample and hold circuits or track and hold circuits may be provided as input stages for the A/D converters 12 and 14, or the sampling function may be added to the A/D converters. Since there is a 180 degree phase difference between the clock signals applied to the A/D converters 12 and 14, these A/D converters sample the analog input signal and convert the sampled signal into the digital signals alternately. Thus, the maximum sampling frequency of the A/D conversion apparatus is twice (N=2) that of each A/D converter.

The digital output signals from the A/D converters 12 and 14 may be directly selected in alternating fashion by a multiplexer. However, in FIG. 1, the output signals from the A/D converters are stored in memories 20 and 22, such as RAMs, respectively. After the storing operation, the contents of the memories 20 and 22 are read and alternately selected by a multiplexer (MUX) 24. The circuit shown in FIG. 1 may be used in a waveform memory apparatus, a transient digitizer, or a digital oscilloscope, for example.

If the A/D conversion apparatus of FIG. 1 samples a ramp waveform 26 (FIG. 2) and executes the A/D conversion operation at a constant period, i.e. at times $t_{n-1}$, $t_n$, $t_{n+1}$, $t_{n+2}$, the A/D converter 12 samples the ramp waveform 26 and converts the sample values into digital values at the times $t_{n-1}$, $t_{n+1}$, $t_{n+3}$ …

An A/D conversion apparatus architecture for solving the above-described disadvantage, based on the disclosure in U.S. Pat. No. 4,345,241 issued Aug. 17, 1982 and assigned to the assignee of this patent application, is shown in FIG. 3. In this architecture, the A/D converter 12 receives its clock signal through a fixed delay circuit 26, and the A/D converter 14 receives its clock signal through a variable delay circuit 28. The clock signal of the A/D converter 14 leads that of the A/D converter 12 if the delay value of the variable delay circuit 28 is less than that of the fixed delay circuit 26, and the clock signal of the A/D converter 12 leads that of the A/D converter 14 if the delay value of the variable delay circuit 28 is larger than that of the fixed delay circuit 26. In other words, it is possible to adjust selectively the phase differences between the clock signals of the A/D converters 12 and 14.

In order to adjust the phase difference between the clock signals, a ramp generator 32 is selected by a switch 30 so that the ramp waveform signal shown by a solid line 26 in FIG. 2 is applied to both the A/D converters 12 and 14. The A/D converters 12 and 14 alternately convert the ramp waveform signal 26 into digital form and store the converted digital values in the memories 20 and 22 sequentially. After storing a predetermined number of digital values, a control circuit 34, such as a central processing unit (CPU), obtains the digital values $d_{n-1}$, $d_{n+1}$, $d_{n+3}$ … from the memory 20 and the digital values $d_n$, $d_{n+2}$, $d_{n+4}$ … from the memory 22. Then, the control circuit 34 calculates the values $d_n - d_{n-1}$, $d_{n+1} - d_n$, $d_{n+2} - d_{n+1}$, $d_{n+3} - d_{n+2}$ … and adjusts the delay time of the variable delay circuit 28 such that the calculated differences are equal to each other. Thus, the phase difference between the clock signals for the A/D converters 12 and 14 is calibrated.

Therefore, by using the architecture disclosed in U.S. Pat. No. 4,345,241, the conversion error that arises from use of multiple converters can be at least partially eliminated. Hoever, errors may arise due to non-linearity of the ramp waveform if the quantization step of of the A/D converters is small. If the reference signal has a waveform other than a ramp, errors may arise due to deviations between the actual reference waveform and the desired reference waveform. It is very difficult to generate a reference waveform which is sufficiently free of such deviations for calibration of a high accuracy multi-bit A/D conversion apparatus. The architecture disclosed in U.S. Pat. No. 4,345,241, does not enable satisfactory calibration of phase differences of the clock signals for a high accuracy A/D conversion apparatus.

SUMMARY OF THE INVENTION

A preferred embodiment of to the present invention is an A/D conversion apparatus comprises clock generation means for generating N-phase clock signals (N is an integer larger than one) and N A/D converters for sampling a common analog input signal in response to the N-phase clock signals respectively and converting the sampled signal to a digital signal. In order to calibrate a relative phase of the N-phase clock signals, a repetitive reference signal which is synchronized with the clock signals is applied to the N A/D converters in common. Digital output values from the N A/D converters are selected such that the selected digital values are derived from corresponding sampling points of successive cycles of the repetitive reference signal. Then, the relative phase of the N-phase clock signals are adjusted such that the selected digital values of the N A/D converters are substantially equal to each other.

In accordance with the present invention the digital values provided by the N A/D converters at corresponding sampling points of successive cycles of the repetitive reference signal are selected. In principle, the corresponding sample points of each cycle should have the same amplitude regardless of the linearity of the reference signal, and these sample points are sequentially converted to digital values by the different A/D converters. Thus, the phase error can be calibrated by adjusting the relative phase of the N-phase clock signals so that the digital values provided by the A/D converters become substantially equal to each other. Since the phase calibration is not affected by the linearity characteristic of the reference signal, a high accuracy interleave type A/D conversion apparatus can be implemented using multi-bit A/D converters.

The objects, advantages and features of the present invention will become apparent to those having ordinary skill in the art from a reading of the following detailed description when taken in conjunction with the accompanying drawings.

BRIEF DESCRIPTION OF THE DRAWINGS

FIGS. 17-19 illustrate waveforms for explaining modifications of the FIGS. 4 and 15 embodiments.

In the different figures, like reference numerals denote corresponding elements.

DETAILED DESCRIPTION OF THE INVENTION

Figure 4:
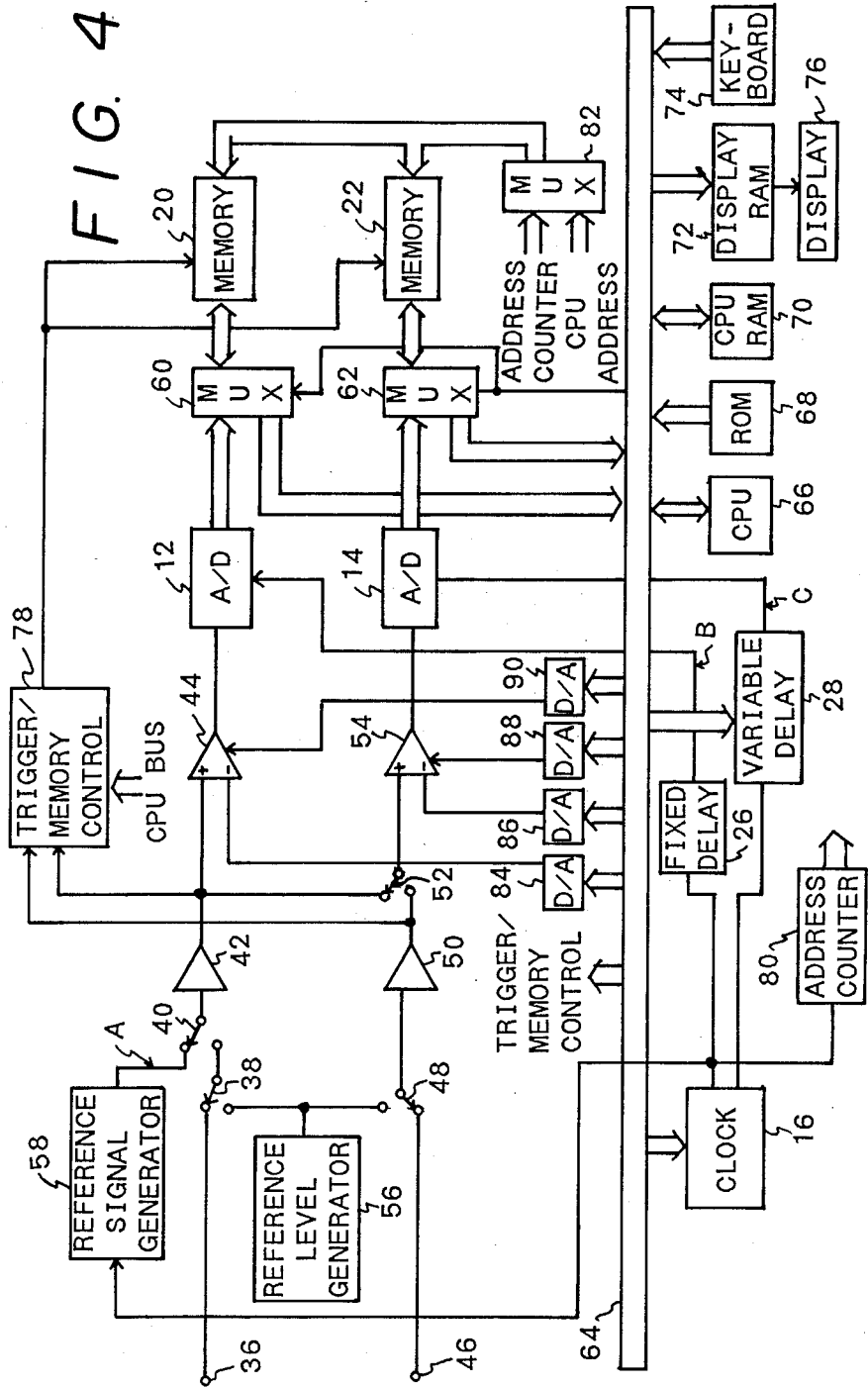
FIG. 4 is a block diagram of a preferred embodiment of the present invenion.

Referring now to FIG. 4, there is shown a block diagram of a two-channel waveform memory apparatus embodying the present invention. A channel A input terminal 36 is connected through switches 38 and 40, a buffer amplifier 42 and a variable gain amplifier 44 to an A/D converter 12. Similarly, a channel B input terminal 46 is connected through a switch 48, a buffer amplifier 50, a switch 52 and a variable gain amplifier 54 to an A/D converter 14. The switch 38 selects the input terminal 36 or a reference level generator 56, the switch 40 selects the switch 38 or a reference signal generator 58, the switch 48 selects the input terminal 46 or the reference level generator 56, and the switch 52 selects the buffer amplifier 42 or 50. The reference level generator 56 generates a DC level for DC offset calibration and a square wave pulse for gain calibration. The reference signal generator 58 generates a repetitive reference signal, e.g., a repetitive ramp waveform, for phase calibration.

Figure 1:
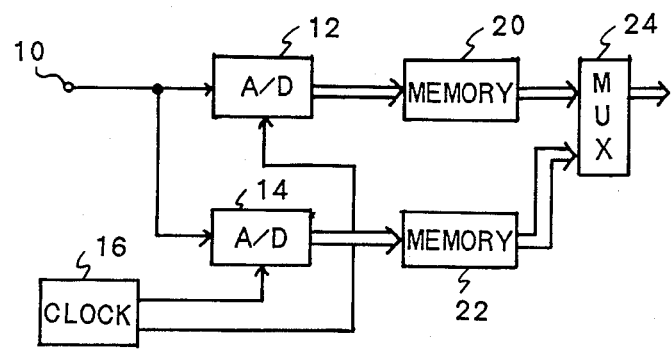
FIG. 1 is a block diagram of a conventional interleave A/D conversion apparatus.
Figure 2:
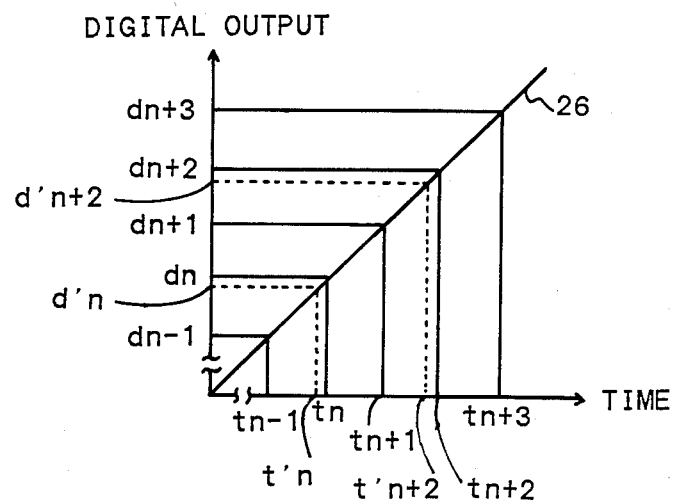
FIG. 2 is a diagram useful in explaining operation of the interleave type A/D conversion apparatus.
Figure 3:
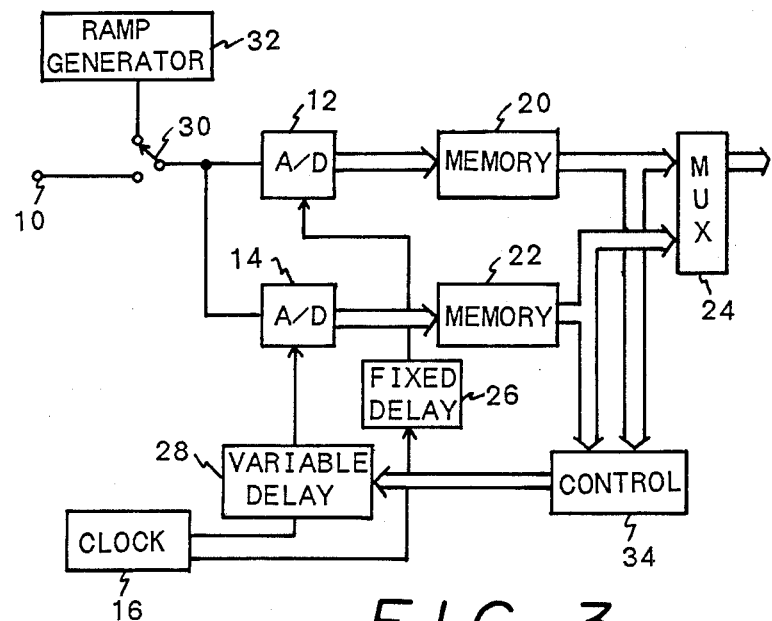
FIG. 3 is a block diagram of another conventional interleave type A/D conversion apparatus including a phase error calibration function.

The A/D converters 12 and 14 may be, for example, parallel comparison type A/D converters or serial-parallel type A/D converters. These A/D converters 12 and 14 receive two-phase clock signals B and C from clock generator 16 through a fixed delay circuit 26 and a variable delay circuit 28 respectively, similarly to the conventional apparatus shown in FIG. 3. The digital output signals from the A/D converters 12 and 14 are respectively applied to memories 20 and 22 through multiplexers (MUXs) 60 and 62. In addition, the output signals read from the memories 20 and 22 are applied to a bus 64 through the multiplexers 60 and 62. The bus 64 is connected to CPU 66 (e.g., type 68000 microprocessor) as control means, a read only memory (ROM) 68 for storing operation programs of the CPU 66 and a CPU RAM 70 operating as a temporary memory. A display RAM 72 and a keyboard 74 are connected to the bus 64. The contents of the display RAM 72 are displayed in a display device 76. A trigger/memory control circuit 78 receives the output signals from the buffer amplifiers 42 and 50 and controls writing and reading modes of the memories 20 and 22 in accordance with information from the bus 64.

An address counter 80 generates a writing address signal by counting one of the clock signals from the clock generator 16. A multiplexer 82 selects either the writing address signal from the address counter 80 or a CPU address signal from the CPU 66 and applies the selected address signal to address terminals of the memories 20 and 22.

D/A converters 84 and 86 control DC offset levels of the amplifiers 44 and 54 respectively in accordance with control signals from the bus 64. D/A converters 88 and 90 control the gains of the amplifiers 54 and 44 respectively in accordance with control signals from the bus 64.

When the switches 38 and 48 respectively select the input terminals 36 and 46, the switch 40 selects the switch 38 and the switch 52 selects the amplifier 50, the apparatus shown in FIG. 4 operates as a two-channel waveform memory apparatus in which the sampling frequency of each channel is equal to the frequency of the clock signals. If the switch 52 is changed to select the amplifier 42, a single-channel waveform memory apparatus, having twice the sampling frequency, is obtained. In the single-channel case, the waveform memory apparatus employs A/D conversion apparatus having N (N=2) A/D converters.

Before calibrating the phase characteristic of the FIG. 4 A/D conversion apparatus, it is necessary that the DC offset and gain characteristics of the A/D converter 12 be made equal to those of the A/D converter 14. This preprocessing calibration is discussed in U.S. Pat. No. 4,364,027, issued Dec. 14, 1982 and assigned to the assignee of this patent application. When a calibration mode is selected through the keyboard 74 or is automatically selected, the CPU 66 first sets each block in FIG. 4 so as to adjust the DC offset characteristic. For this purpose, the switch 38 selects the reference level generator 56, the switch 40 selects the switch 38 and the switch 52 selects the buffer amplifier 42. The multiplexers 60 and 62 select respectively the A/D converters 12 and 14, and the multiplexer 82 selects the address counter 80. The reference level generator 56 generates ground voltage, and the A/D converters 12 and 14 convert this ground voltage into digital values which are written into the memories 20 and 22. This writing operation is controlled by the trigger/memory control circuit 78. After the writing operation, the multiplexers 60 and 62 select the bus 64 and the multiplexer 82 selects the CPU address signal under control of the CPU 66. The CPU 66 reads the digital values stored in the memories 20 and 22 and compares these digital values with the digital value corresponding to ground voltage. If the comparison result indicates that they do not match, the CPU 66 applies correction signals to the D/A converters 84 and 86 in accordance with the errors such that the DC offset levels of the amplifiers 44 and 54 are calibrated so as to cancel the errors. The above-described calibration operation is repeated until the comparison error is within a predetermined range or is cancelled.

After calibrating the DC offset level, the CPU 66 sets each block in FIG. 4 to calibrate the gain. The reference level generator 56 generates a square wave signal whose amplitude is between +V volts and −V volts to cover the dynamic range of the A/D converters. Similarly to the DC offset calibration, the pulse is converted to digital form by the A/D converters 12 and 14 and the resulting digital values are stored in the memories 20 and 22. The CPU 66 calculates the difference between the stored digital values corresponding to +V volts and −V volts levels of the square wave signal and compares the calculated difference with the digital value corresponding to a voltage difference equal to 2 V. If the comparison result indicates a gain error, the CPU 66 applies digital correction values to the D/A converters 88 and 90 for calibrating the gains of the amplifiers 44 and 54. The above-described operations are repeated until the comparison error is within a predetermined range or is cancelled. These operations are executed for each signal path, wherein one path includes the amplifier 44 and the A/D converter 12 and the other path includes the amplifier 54 and the A/D converter 14.

The DC offset level calibration and the gain calibration are repeated alternately so that the DC level and the gain of the signal path including the A/D converter 12 match substantially those of the signal path including the A/D converter 14. Thus, the preprocessing for the phase calibraton is accomplished. If it is desired to use the apparatus of FIG. 4 as a two-channel apparatus, the switches 48 and 52 select respectively the reference level generator 56 and the amplifier 50 and the above-described calibration is executed.

Figure 5:
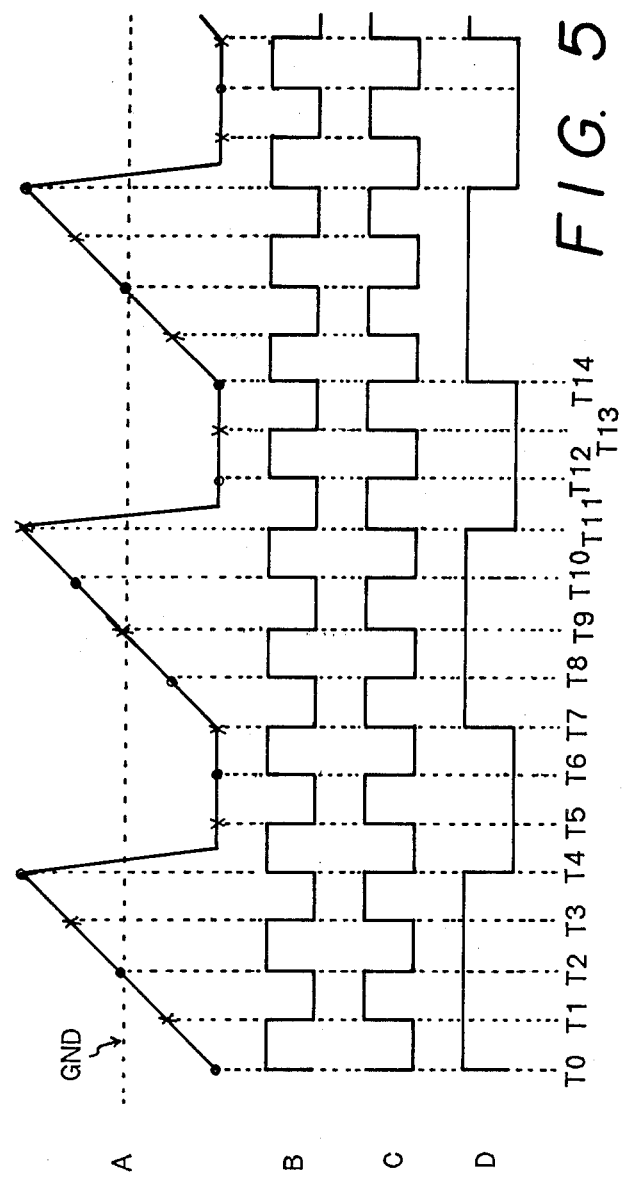
FIG. 5 is a timing diagram for explaining the operation of the FIG. 4 embodiment.

The technique for phase calibration will now be described. It should be noted that the following operations are controlled by the CPU 66 in accordance with the program stored in the ROM 68, using the RAM 70 as a temporary memory. When the phase calibration mode is selected, the switches 40 and 52 select respectively the reference signal generator 58 and the amplifier 42 under control of the CPU 66. In this embodiment, the period ratio of the ramp reference signal A generated by the reference signal generator 58 to the clock signal generated by the clock generator 16 is 7:2. FIG. 5 shows the timing relation among the reference signal A, the clock signal B for the A/D converter 12 and the clock signal C for the A/D converter 14. The amplitude of the waveform A of FIG. 5 substantially covers the dynamic range of the A/D converters, and ground voltage GND is indicated by a dotted line. Similarly to the DC level and gain calibrations, the CPU 66 controls the multiplexers 60, 62 and 82 so as to select the A/D converters 12 and 14 and the address counter 80, respectively.

Figure 6:
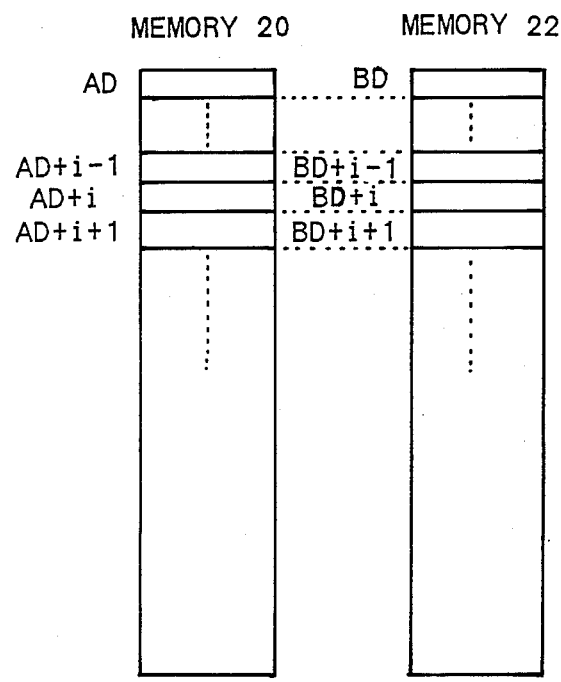
FIG. 6 illustrates memory maps of memories used in the FIG. 4 embodiment.

The trigger/memory control circuit 78 places the memories 20 and 22 in the writing mode. Since the A/D converters 12 and 14 sample the analog input signal at the positive-going edge of th clock signal and convert the analog sample values into digital values, the A/D converter 12 samples the reference signal A at times T0, T2, T4, T6, T8, T10, T12, T14 . . . and converts the sample values into digital values, and the A/D converter 14 samples the reference signal A at time T1, T3, T5, T7, T9, T11, T13 . . . and converts the sample values into digital values. In other words, marks 0 and X indicate the conversion time points of the A/D converters 12 and 14 respectively with reference to the waveform A of FIG. 5. When the memories 20 and 22 have accumulated a predetermined number of digital values from the A/D converters 12 and 14, the trigger/memory control circuit 78 stops the writing mode. In this embodiment, when starting the writing mode, the A/D converter 12 samples the reference signal before the A/D converter 14 does so. Assuming that the memories 20 and 22 store the digital values commencing with addresses AD and BD respectively, the memory 20 stores sequentially the digital values corresponding to three consecutive occurrences of the mark 0 at addresses AD+i−1, AD+i and AD+i+1, where i is any integer, and the memory 22 stores sequentially the digital values correponding to three consecutive occurrences of the mark X at addresses BD+i−1, BD+i and BD+i+1 as shown in FIG. 6.

The next step is the reading mode, wherein the multiplexers 60 and 62 select the bus 64 and the multiplexer 82 selects the CPU address. The CPU 66 reads sequentially the digital values stored in the memories 20 and 22 and selects the digital values at or closest to the value representing ground voltage. In the case of FIG. 5, these are the values at the time T2, T9 . . . . If the selected digital values are equal to each other, the total A/D conversion phase characteristic of the A/D conversion apparatus is equivalent to 180 degrees, which is the normal condition. However, if the selected digital values stored in memories 20 and 22 differ from each other, the CPU 66 controls the phase relation of the clock signals B and C for the A/D converters 12 and 14 by adjusting the delay time of the variable delay circuit 28 such that the selected digital values become equal to each other. The writing and reading operations for the phase calibration are repeated until the selected digital values are equal to each other or the difference therebetween is within a predetermined acceptable tolerance. It should be noted the the ramp reference signal A from the reference signal generator 58 is synchronized with the clock signals from the clock generator 16, but the value of the reference signal A might not be ground voltage at a sampling (A/D conversion) time point. The sample values closest to ground voltage are selected for comparison because these values are close to the center of the dynamic range of the reference signal and therefore are relatively stable.

Figure 7:
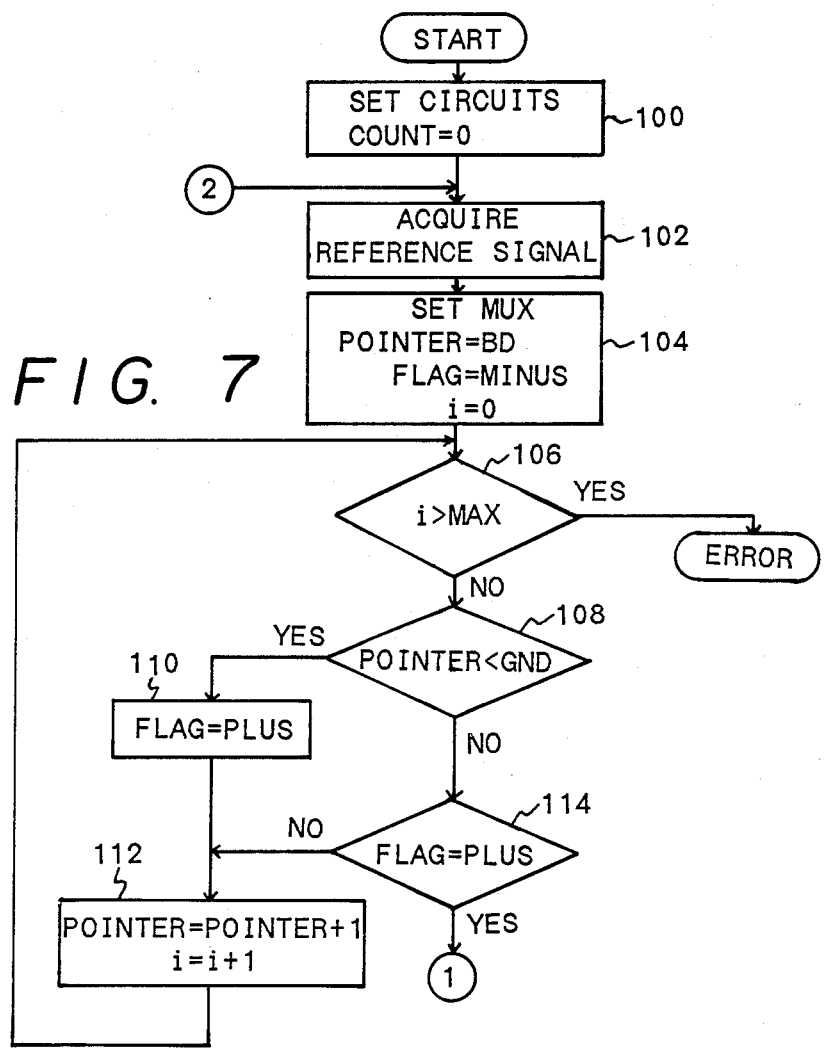
FIGS. 7 through 9 illustrate flow charts for explaining the operation of the FIG. 4 embodiment.

The phase calibration will be further discussed in detail by reference to flow charts shown in FIGS. 7 through 9. When the phase calibration mode is selected automatically or through the keyboard 74, step 100 is executed and the CPU 66 sets the clock generator 16, the switches 40 and 52, the trigger/memory control circuit 78 and the multiplexers 60, 62 and 82 to proper settings and further sets the count value representing the number of calibration operations to zero. In step 102, the ramp reference signal A is written into the memories 20 and 22 as described hereinbefore. After the writing mode, the reading mode starts from step 104 wherein the multiplexers 60, 62 and 82 are switched, a pointer is set to the the address BD of the memory 22 (see FIG. 6), a flag is set to minus and a relative value i of the pointer is set to zero. Then, step 106 follows to determine whether the relative value i is larger than the number MAX of digital values stored in either the memory 20 or the memory 22 in the writing mode. Of course, the number of values stored in the memory 20 should be equal to the number of values stored in the memory 22. If i>MAX, phase calibration does not take place because the pointer does not indicate data acquired in the step 102. In this instance, the calibration is not executed because of circuit failure.

If i is found in the step 106 to be equal to or less than MAX, step 108 follows. It should be noted that the phase calibration is executed by using the sample values around ground voltage on the positive-going slope of the ramp reference signal A, the A/D converter 12 starts the acquisition first and the pointer is set in step 104 to the address BD of the memory 22 for the A/D converter 14. In the step 108, the CPU 66 determines whether the content of the address indicated by the pointer (i.e., the content of the pointer) is lower than ground voltage GND. When the answer is YES, the flag is changed to plus in step 110, the pointer and the i are each incremented by one respectively in step 112, and the process returns to the step 106. When the content of the pointer is found to be equal to or larger than ground voltage GND in the step 108, step 114 determines whether the flag is plus. If the flag is minus, the step 112 follows. However, if the flag is plus, the procedure flows to step 116 in FIG. 8. The steps 108 through 114 are executed for identifying the first sampling point after the digital output signal from the A/D converter 14 changes from negative to positive. The step 114 ensures that the digital date changes from a value lower than ground voltage GND to a value higher than ground voltage GND.

In the step 116, the CPU 66 calculates the difference between the digital value A derived from the output of the converter 12 and the digital value B derived from the output of the A/D converter 14, where the values A and B are obtained from sampling alternate cycles at corresponding points at about ground voltage, i.e. close to the center value of the range of the reference signal. There are four possibilities, as shown in FIGS. 10A through 10D respectively, when the procedure flows to the step 116. In FIGS. 10A through 10D, the marks 0 and X indicate the A/D conversion time points of the channels A and B respectively, as shown in FIG. 5. FIGS. 10A and 10B indicate that the content of the pointer AD+i in the channel A (memory 20) is the closest to ground voltage GND, FIG. 10C shows that the content of the pointer BD+i of the channel B (memory 22) is the closest to ground voltage GND and FIG. 10D shows that the content of the pointer BD+i−1 of the channel B is the closest to ground voltage GND. Considering these cases, the procedure calculates the difference between the values A and B in the step 116 which will be discussed in detail with reference to FIG. 9.

Figure 9:
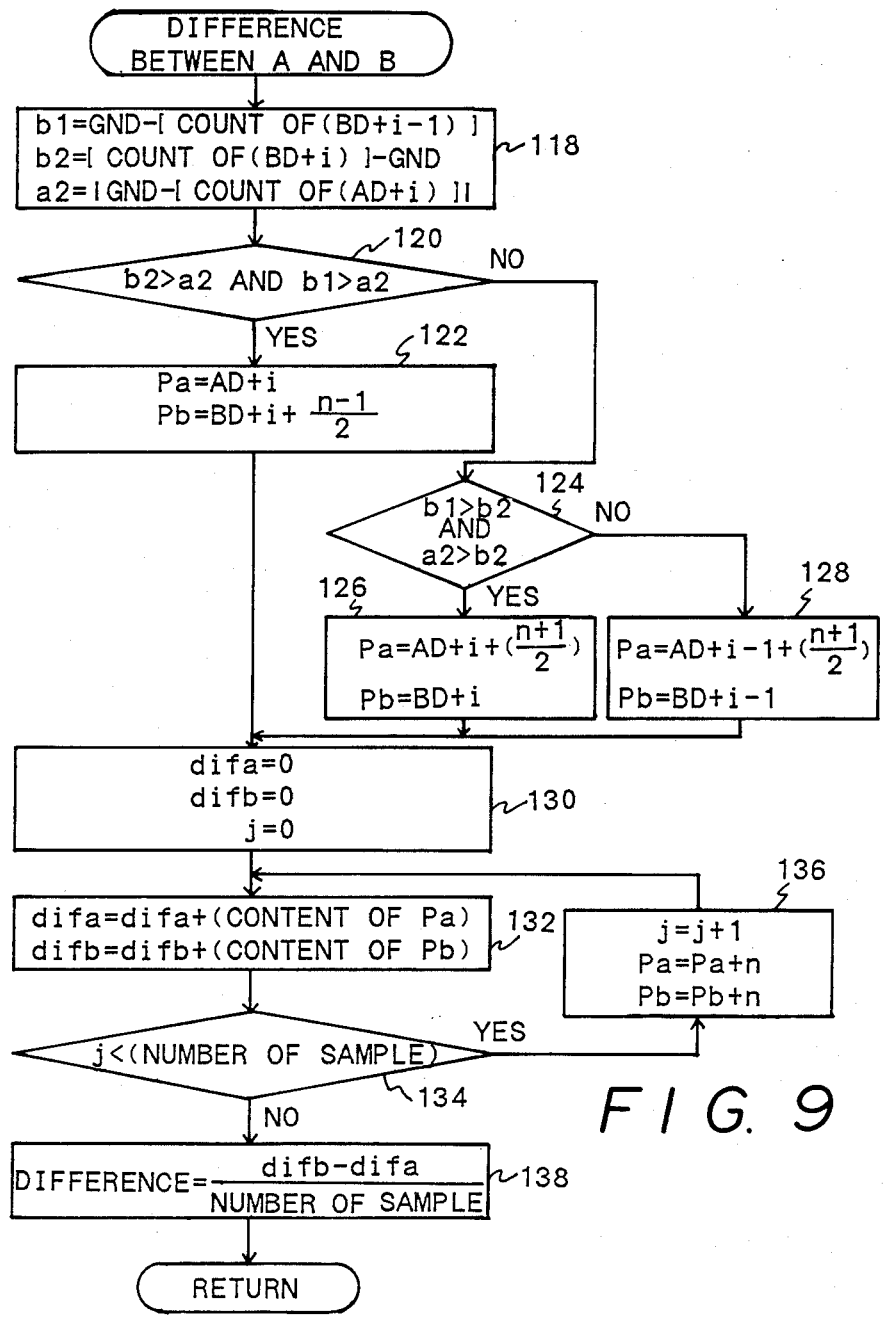
Figure 10C:
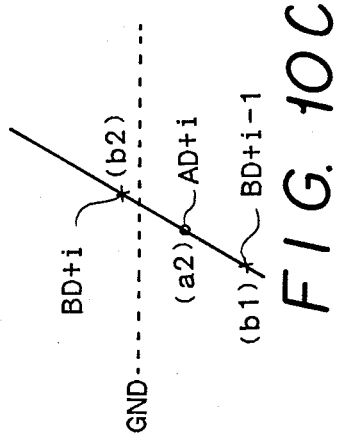
FIG. 10A through 10D illustrate waveforms for explaiing the operation of the FIG. 4 embodiment.
Figure 10D:
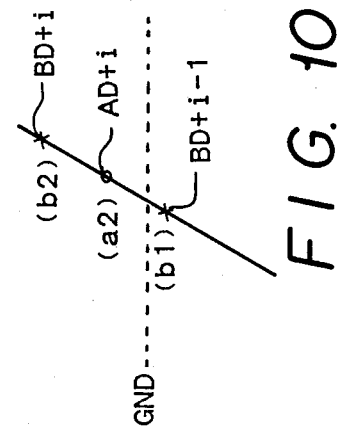
Figure 10A:
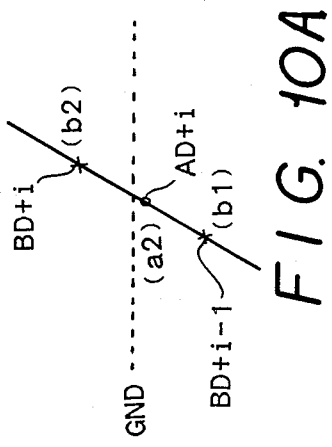
Figure 10B:
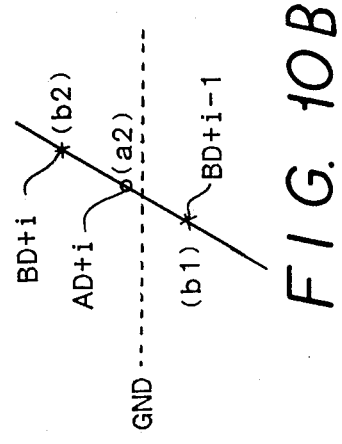

In FIG. 9, the step 118 determines which of the cases shown in FIGS. 10A through 10D applies when the procedure enters the step 116 by calculating a value b1 representing the difference between the content of the pointer BD+i−1 and ground voltage GND, a value b2 representing the difference between the content of the pointer BD+i and ground voltage GND and a value a2 representing the difference between the content of the pointer AD+i and ground voltage GND as follows:

$$b1 = GND - [\text{content of } (BD+i-1)]$$

$$b2 = [\text{content of } BD+i] - GND$$

$$a2 = |GND - [\text{content of } (AD+i)]|$$

It should be noted that the digital output value from the A/D converter 12 or 14 is not positive or negative with respect to ground voltage GND. If each digital value has eight bits, 0000 0000 represents −V, 1000 0000 represents ground level and 1111 1111 represents substantially +V. In step 120, the CPU 66 determines whether the value b2 is larger than the value a2 and the value b1 is larger than the value a2, i.e., whether the present condition matches one of the cases shown in FIGS. 10A and 10B. Step 122 follows if YES, or step 124 follows if NO. In step 124, the procedure determines whether the value b1 is larger than the value b2 and the value a2 is larger than the value b2, i.e., whether the present condition matches the case of FIG. 10C. The procedure flows to step 126 if the result is YES. However, the procedure flows to step 128 if the result is NO (FIG. 10D).

Figure 12:
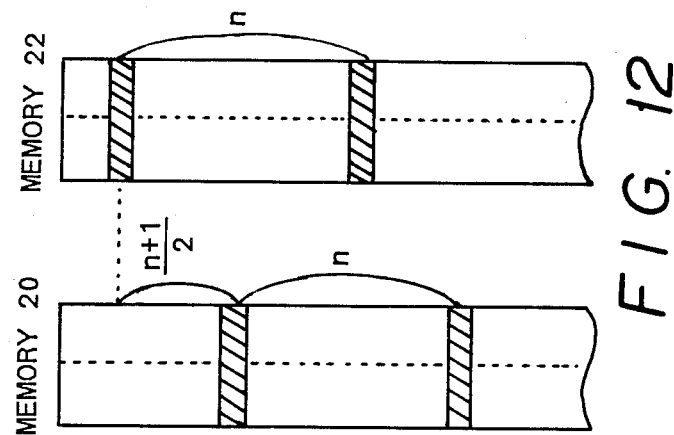
FIGS. 11 and 12 illustrate memory maps of the memories used in FIG. 4.
Figure 11:
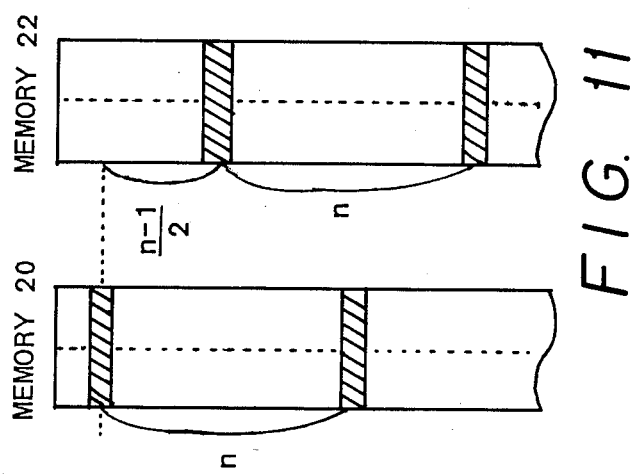

Since the period ratio of the reference signal to the clock signal is an odd ratio (7:2) as mentioned hereinbefore, the corresponding sample point occurs in the channels A and B alternately in consecutive cycles of the reference signal. In step 122 corresponding to the cases of FIGS. 10A and 10B, the first pointer Pa in the memory 20 is set to AD+i and the first pointer Pb in the memory 22 is set to BD+i+(n−1)/2, where n is the number of sample points within one cycle of the reference signal. In this embodiment, n is seven. In other words, the data to be selected is stored every n addresses in each memory. Similarly, in the step 126 corresponding to the case of FIG. 10C, the pointer Pa is set to AD+i+(n+1)/2 and the pointer Pb is set to BD+i. In the step 128 corresponding to the FIG. 10D, the pointers Pa and Pb are set to AD+i−1+(n+1)/2 and BD+i−1, respectively. These steps 122, 126 and 128 will be understood from the following discussion by reference to FIGS. 11 and 12. Recalling that digital values are written into the memories 20 and 22 in alternating fashion, and that the first digital value was written into the memory 20, it follows that if the first selected digital value, i.e. the value that represents the sample point that is closest to ground voltage on the first cycle to be examined, were stored in the memory 20 at the address AD+i, the next address (pointer) to be selected would be the address BD+i+(n−1)/2 of the memory 22, and the successive addresses to be selected would be located every n addresses in each memory as shown in FIG. 11. If the first selected digital value were at the address BD+i of the memory 22, the next address to be selected would be the address AD+i+(n+1)/2 of the memory 20, and the successive addresses to be selected would be located every n addresses in each memory as shown in FIG. 12.

After determining the pointers to be selected for each memory in the steps 122, 126 and 128, the procedure flows to step 130 where sums difa and difb and a value j are set to zero. The sums difa and difb represent accumulated sums of the digital values stored in the selected addresses in the memories 20 and 22 respectively (hereinafter referred to as "selected digital values"), and j represents the number of selected digital values that have been used in calculating the sums of difa and difb. In the next step 132, the accumulated sums of the selected digital values stored in each of the memories are obtained by calculating as follows:

difa=difa+(content of Pa)

difb=difb+(content of Pb)

In step 134, the CPU 66 determines whether all the selected digital values have been accumulated. If the selected digital values have not yet all been accumulated, the procedure flows to step 136 where j is incremented by one and Pa and Pb are each incremented by n, and the procedure returns to the step 132. When all the selected digital values have been accumulated, the step 134 directs the program flow to step 138, where the average value of the difference is obtained by dividing the difference between the sums difb and difa by the number of samples that were written into each memory in the writing mode, i.e. the final value of j. After that, the procedure returns to the step 116 of FIG. 8 and flows to step 140.

In the step 140, the CPU 66 determines whether the count value, i.e. the number of data acquisition operations (step 102, FIG. 7) is less than 256. If the count value is less than 256, the procedure flows to step 146 wherein the CPU 66 determines whether the difference obtained in the step 138 is zero, i.e., whether the relative phase difference of the clock signals for the A/D converters 12 and 14 is equivalent to 180 degrees. If the difference is zero, the phase calibration ends. However, if the difference is not zero, step 150 follows. If the count value is equal to or larger than 256 in the step 140, the procedure flows to step 152 where it is determined whether the count value is less than 512. If the relative phase does not become zero or within the predetermined tolerance range before the count value reaches 512, i.e., before the number of the data acquisition operations reaches 512, the procedure is in error similarly to the step 106 of FIG. 7. If the count value is between 256 and 511, step 154 follows for determining whether the difference obtained in the step 138 is between −1 and +1. The object of the step 154 is to make the phase tolerance looser because the phase calibration operation has not yet ended. If the result of the step 154 is YES, the phase calibration is accomplished. However, if the result is NO, the procedure flows to step 150.

In the step 150, the phase correction value is calculated in accordance with the difference obtained as the result of the step 138. It should be noted that the phase correction value is directly proportional to the difference between the values A and B because the reference signal is a ramp waveform. In step 156, the variable delay circuit 28 is controlled in response to the correction value. The count value is incremented by one in step 158, and the procedure returns to the step 102 in FIG. 7. The phase calibration is completed by repeating the above-described operations.

In the above-described embodiment, the phase calibration is executed by reference to the sample values adjacent to the center portion of the reference signal. However, if the high frequency characteristics of the A/D converters are not good and the digital output signals therefrom include errors, it is possible to execute the phase calibration by using the value of three points, namely, the center sample value, the first sample value that occurs after the center sample and last sample value that occurs before the center sample, and evaluating these three sample values together. In this instance, the three sample values for each cycle of the reference signal may be accumulated in the memories 20 and 22, and the differences of the accumulated values may be used to execute the phase calibration. In other words, in FIG. 5, the center sample values digitized by the A/D converters 12 and 14 correspond to the time points T2 and T9 respectively, the higher sample values digitized by the A/D converters 12 and 14 correspond to the time points T10 and T3 respectively, and the lower sample values digitized by the A/D converters 12 and 14 correspond to that which is illustrated by the time points T8 and T1 respectively. Since the algorithm of this embodiment is similar to the flow charts shown in FIGS. 7, 8 and 9, only the differences will be discussed in detail The lower value pointers La and Lb for the memories 20 and 22 are La=AD+i+(n−1)/2

Lb=BD+i−1 in the case of the step 122. In the case of the step 126, the pointers La and Lb are as follows:

La=AD+i

Lb=BD+i−1+(n+1)/2

Moreover, the pointers La and Lb in the case of the step 128 are as follows:

La=AD+i−1

$$Lb = BD + i - 2 + (n+1)/2$$

The higher value pointers Ha and Hb for the memories 20 and 22 are as follows for the case of each of the steps 122, 126 and 128.

$$Ha = La + 1$$

$$Hb = Lb + 1$$

In the step 130, sums higa, higb, lowa and lowb are set to zero simultaneously with setting the difa, difb and j to zero, wherein higa and higb represent accumulated sums of the contents of the pointers Ha and Hb respectively and lowa and lowb represent accumulated sums of the contents of the pointers La and Lb respectively. The step 132 further calculates the higa, higb, lowa and lowb as follows:

$$higa = higa + (\text{content of } Ha)$$

$$higb = higb + (\text{content of } Hb)$$

$$lowa = lowa + (\text{content of } La)$$

$$lowb = lowb + (\text{content of } Lb)$$

In the step 136, Ha, Hb, La and Lb are each incremented by n similarly to Pa and Pb. The step 138 is modified to obtain the average difference, i.e., $$\frac{(difb - difa) + (higb - higa) + (lowb - lowa)}{\text{number of samples}}$$

Figure 8:
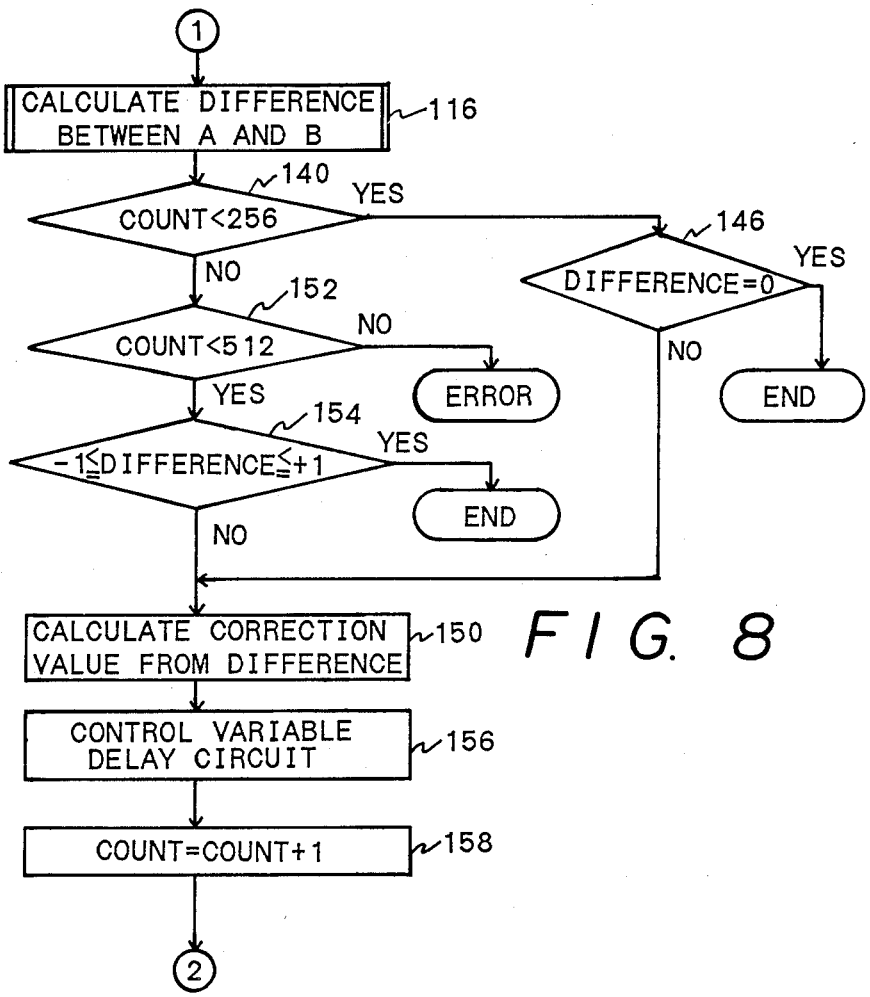

This difference is returned to the step 116 in FIG. 8. The other operations are the same as those described with reference to FIGS. 7 through 9.

After the phase calibration, the normal A/D conversion is executed by changing the switches 38 and 40 to the input terminal 36 and the switch 38, respectively. The converted digital signals stored in the memories 20 and 22 are transferred to the display RAM 72, converted to analog form and displayed by the display device 76, or the digital signals may be processed by the CPU 66 in response to various kinds of programs and transferred to other apparatus, such as a host computer.

Figure 13:
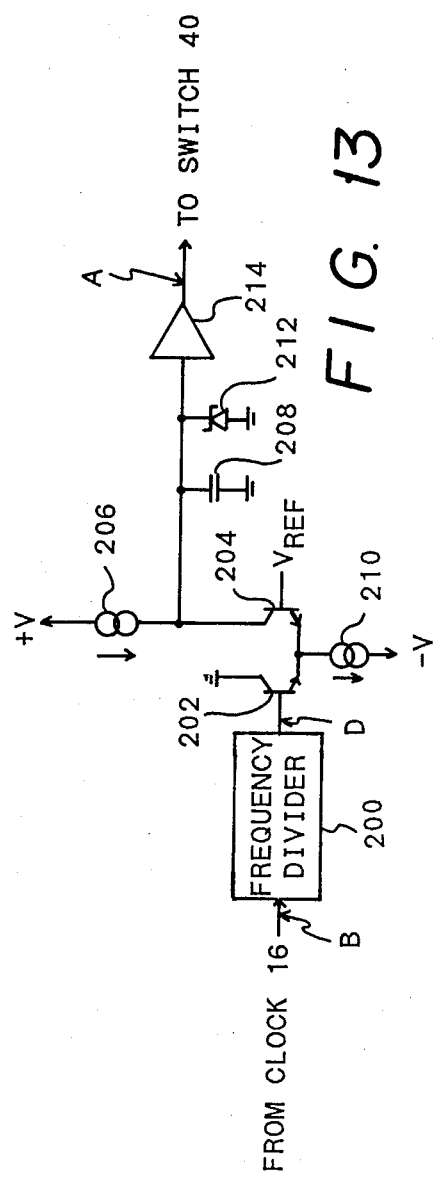
FIG. 13 is a circuit diagram of a reference signal generator used in the FIG. 4 embodiment.

An example of the reference signal generator 58 will now be described with reference to the circuit diagram of FIG. 13 and the time chart of FIG. 5. A frequency divider 200 receives the clock signal B from the clock generator 16 and divides the frequency of the clock signal B by 3.5 so as to generate a digital waveform D. Differentially connected transistors 202 and 204 act as a switching circuit which compares the digital signal D with a reference level $V_{REF}$ and turns on the transistors 202 and 204 alternately. When the digital signal D is high (from the time T0 to the time T4), the transistor 202 is on and the transistor 204 is off, and vice versa when the signal D is low (from the time T4 to the time T7). When the transistor 204 is off and the transistor 202 is on, a current source 206 connected to the collector of the transistor 204 charges a capacitor 208 linearly with a constant current. When the transistor 204 is on and the transistor 202 is off, a current source 210 connected to the emitters of the transistors 202 and 204 sinks the current from the current source 206 and discharges the capacitor 208. The current value of the current source 210 is much larger than that of the current source 206, and therefore the capacitor 208 is rapidly discharged. A constant voltage diode 212 prevents the voltage across the capacitor 208 from being drawn lower than a predetermined negative voltage. The voltage across the capacitor 208 is applied to the switch 40 through a buffer amplifier 214. Since the charging and discharging operations of the capacitor 208 are synchronized with the clock signal B, the ramp reference signal A is generated in synchronism with the clock signal.

Figure 14:
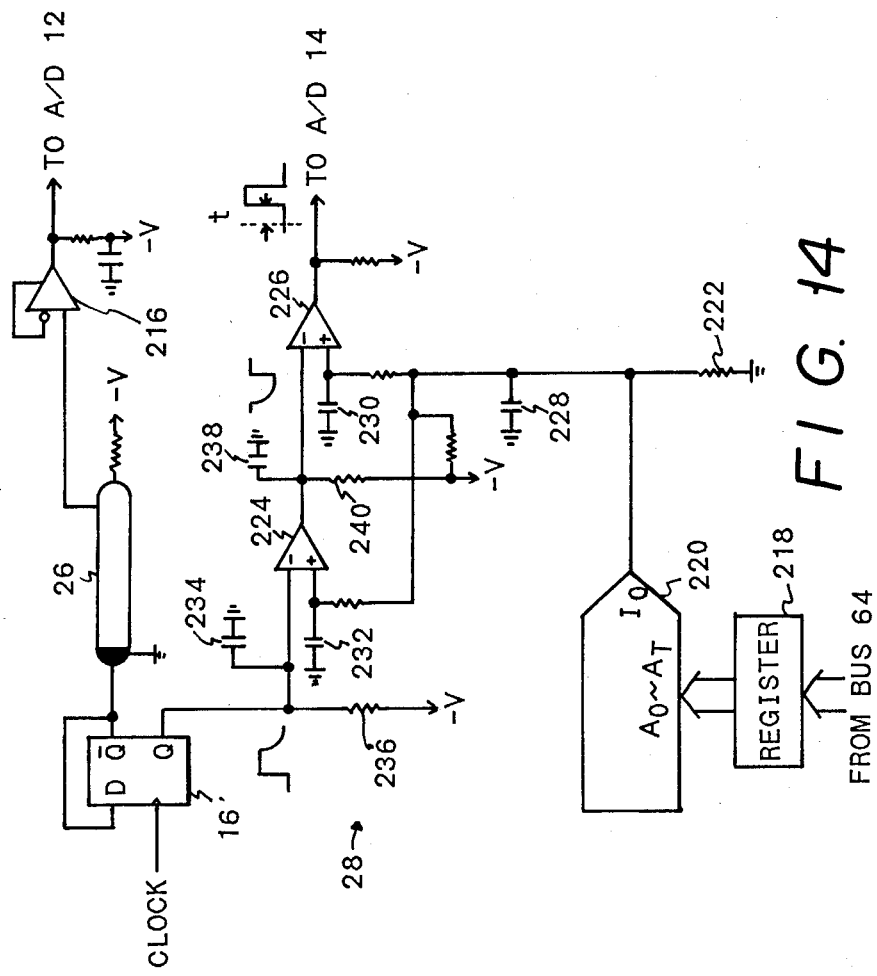
FIG. 14 is a circuit diagram of a variable delay circuit used in the FIG. 4 embodiment.

FIG. 14 is a circuit diagram of the variable delay circuit 28 and related circuits. A flip-flop 16' which is part of the clock generator 16 of FIG. 4 receives a signal at twice the frequency of the desired clock signals and divides the frequency of this by two and generates non-inverted and inverted clock signals at terminals Q and /Q thereof respectively, wherein the duty factor of the divided clock signals is fifty percent. The clock signal from the /Q terminal is applied to the A/D converter 12 via the fixed delay circuit 26, comprising a conventional delay line, and an amplifier 216, and the clock signal from the Q terminal is applied to the A/D converter 14 via the variable delay circuit 28. The delay correction signal from the bus 64 is latched by a register 218. A D/A converter 220 receives the digital signal from the register 218 at digital terminals A0 through A7, converts the digital signal into a corresponding analog current and outputs this analog current from a terminal Io. The output current from the D/A converter 220 flows through a resistor 222 and is converted into a voltage, which establishes a threshold level for comparators 224 and 226. Capacitors 228 through 232 stabilize the threshold level.

The clock signal from the Q terminal of the flip-flop 16' is converted into a logarithmic waveform whose falling portion depends on the time constant of a capacitor 234 and a resistor 236, and the logarithmic waveform is applied to the inverting terminal of the comparator 224. Similarly, the inverted output signal from the comparator 224 is converted into a logarithmic waveform whose falling portion depends on the time constant of a capacitor 238 and a resistor 240 and is applied to the inverting input terminal of the comparator 226. It should be noted that the time constant of the capacitor 234 and resistor 236 is the same as that of the capacitor 238 and resistor 240. Since the non-inverting input terminals of the comparators 224 and 226 each receive the threshold voltage level corresponding to the output current from the D/A converter 220 as described hereinbefore, the comparator 224 delays the trailing edge portion of the clock signal and the comparator 226 delays the leading edge portion thereof. Thus, the comparator 226 generates at its output terminal a clock signal which has the same pulse width as the clock signal at the Q output terminal of the flip-flop 16' and is delayed by a time t determined by the threshold level. Thus, the phase relationship between the two-phase clock signals can be selectively adjusted. The devices 218 through 226 form the variable delay circuit 28. However, the variable delay circuit may comprise a delay line having a plurality of taps and a multiplexer for selecting one of the taps of the delay line.

Figure 15:
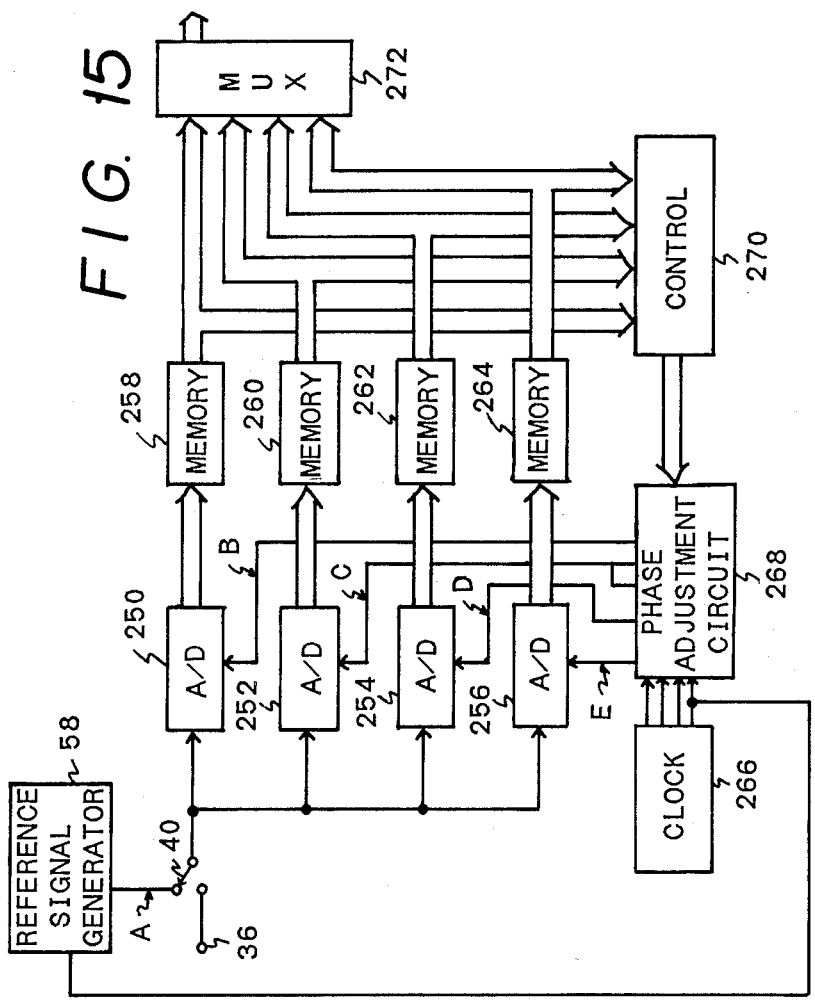
FIG. 15 illustrates a block diagram of another embodiment of the present invention.

FIG. 15 illustrates a block diagram of another A/D conversion apparatus to which the present invention can be applied. In this block diagram, there are four groups (N=4) of A/D converters 250 through 256 and memories 258 through 264, and a clock generator 266 generates four-phase clock signals whose phases are shifted sequentially by 90 degrees. These four-phase clock signals are applied to the A/D converter 250 through 256 via a phase adjustment circuit 268. A control circuit 270 which may comprise, e.g., a CPU, a ROM and a CPU RAM similarly to FIG. 4, controls the phase adjustment circuit 268 in response to digital signals stored in the memories 258 through 264. A multiplexer 272 selects the digital output signals from the memories 258 through 264 in sequence so as to generate a signal which is continuous in time. The reference signal generator 58 is the same as that used in the FIG. 4 apparatus. Other circuits, such as a trigger/memory control circuit and an address counter, are similar to those used in the FIG. 4 apparatus, and are not shown.

Figure 16:
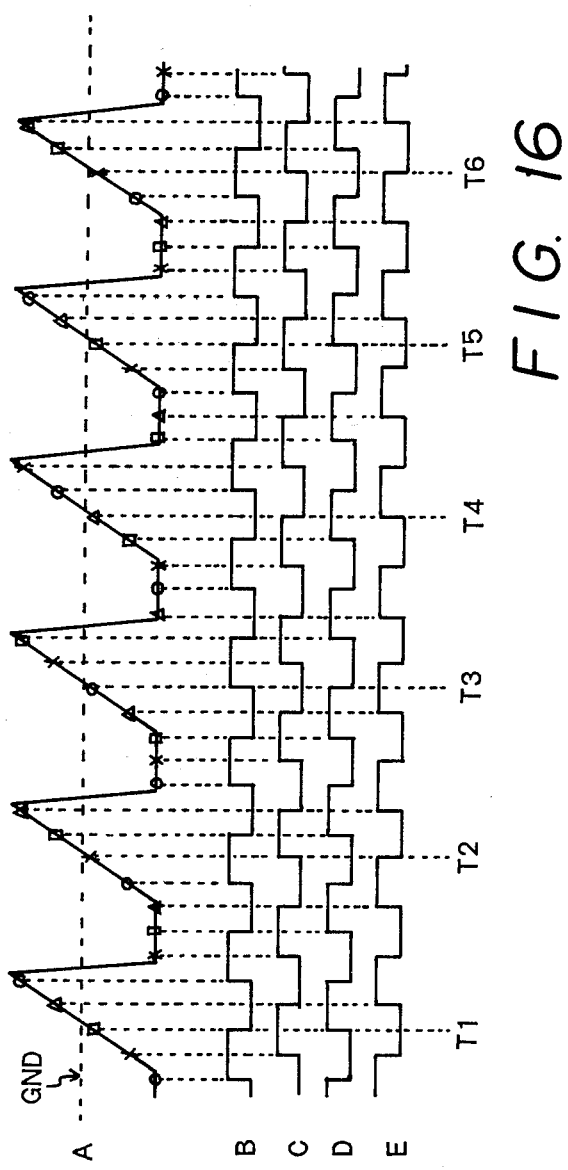
FIG. 16 illustrates waveforms for explaining the operation of the FIG. 15 embodiment.

Since the A/D conversion apparatus of FIG. 15 drives four A/D converter groups with the four-phase clock signals, the maximum sampling frequency of the entire apparatus is four times the maximum sampling frequency of each A/D converter. Before calibrating the phase relationship of the clock signals such that each A/D converter of the A/D conversion apparatus effectively operates with a 90 degree phase difference relative to two other A/D converters, the DC offset level and the gain of each A/D converter are calibrated similarly to the embodiment of FIG. 4. The switch 40 selects the reference signal generator 58 for the phase calibration. The reference signal generator 58 generates a ramp waveform signal A (FIG. 16) in synchronism with the clock signal. Ground voltage GND is at the center of the range of the ramp signal and the period ratio of the ramp signal to the clock signal is, for example 7:4. The timing relationships among the ramp waveform signal A and the clock signals B through E that are applied to the A/D converter 250 through 256 are shown in FIG. 16. In the reference waveform A, a circle mark indicates a point to be sampled and converted to a digital value by the A/D converter 250, a cross mark indicates a point to be sampled and converted to a digital value by the A/D converter 252, a square mark indicates a point to be sampled and converted to a digital value by the A/D converter 254 and a triangle mark indicates a point to be sampled and converted to a digital value by the A/D converter 256. Since the signal path of each A/D converter is different from that of each other A/D converter, the rising start time point of the ramp waveform might not be perfectly coincident with the leading or trailing edge of the clock signal.

After the memories 258 through 264 have stored a predetermined number of the digital values from the A/D converters 250 through 256. The control circuit 270 reads the contents of the memories 258 through 264 and selects the values closest to ground voltage GND. The selected values are the digital value provided by the A/D converter 254 at the time T1, the digital value provided by the A/D converter 256 at the time T2, the digital value provided by the A/D converter 250 at the time T3, the digital value provided by the A/D converter 252 at the time T4, and so on. The control circuit 270 controls the phase adjustment circuit 268 to adjust the relative phases of the clock signals B through E such that these digital values match each other. In this instance, the relative phases of the clock signals C through E may be adjusted with respect to the clock signal B such that the digital values provided by the A/D converters 252 through 256 match the digital value provided by the A/D converter 250 or are within a predetermined range of that value. The other operations will not be described because they are similar to those described with reference to the flow charts shown in FIGS. 7 through 9. The phase adjustment circuit 268 may be similar to that shown in FIG. 14.

A ramp waveform is used as the reference signal in the above-described embodiments, because the correction value is directly proportional to the sample value obtained in the phase calibration operation and therefore it is easy to calibrate the relative phases. However, the reference signal may be a sine wave as shown in FIG. 17. If there are two A/D converters connected in parallel for interleaved operation, circle marks shown in FIG. 17 represent the points to be sampled by the first A/D converter and cross marks represent the point to be sampled by the second A/D converter. In this example, the period ratio of the sine wave reference signal to the clock signal is 5:2, so that the center portion of the rising edge of the reference signal is sampled and converted into a digital value by the first and second A/D converters alternately. The relative phase of the clock signals is adjusted so as to make the sampled values equal to ground voltage GND.

If it is difficult to adjust the sample values to be equal to ground voltage GND as shown in FIG. 18, the relative phase of the clock signals may be adjusted such that the sample values are made equal to each other. In this instance, the correction value may be obtained directly from the difference between the sample values by using a trigonometrical function, or alternatively the relative phases of the clock signals may be changed step by step until the sample values are equal to each other or within a predetermined range.

The positive-going portion of the above-described reference signal is sampled for the phase calibration. It is desirable to sample the same slope portion of the reference signal in order to achieve high accuracy phase calibration because circuit characteristics on the rising portion of the waveform do not perfectly match those on the falling portion thereof in amplifiers, A/D converters and the like. Thus, it is desirable to use either the rising portion or the falling portion of the reference waveform for the phase calibration. For this purpose, the period (or frequency) ratio of the reference signal to the clock signal should be an odd ratio, such as 7:2, 7:4, 5:2 or the like. Generally speaking, this relationship is N:(N−1), N:(N+1), N:(2N−1), N:(2N+1), N:(3N−1), N:(3N+1) . . . or (N−1):N, (2N−1):N, (2N+1):N . . . , i.e., N:(kN−1), (kN−1):N, N:(kN+1), (kN+1):N, where k is a positive integer. However, the period ratio of the reference signal to the clock signal may be an even ratio as shown in FIG. 19 if a high degree of accuracy is not required or the waveform of the reference signal is symmetrical, so that the rising slope is the same as the falling slope. In FIG. 19, a sine wave is used as the reference signal similarly to FIGS. 17 and 18 and the sample points adjacent to ground voltage GND are selected for the phase calibration. The rising portion of the sine wave is used for the first A/D converter and the falling portion thereof is used for the second A/D converter. The same sampling portions are used correspondingly in each cycle of the reference signal. The phase calibration method is similar to the method described above.

As can be understood from the foregoing description, it is possible to use the present invention to calibrate the phase relationship of the so-called interleave type A/D conversion apparatus accurately regardless of the linearity of the reference signal, because the reference signal is synchronized with the clock signal and the phase calibration is executed by using the digital value from each A/D converter representing corresponding sample point of each cycle of the reference signal.

While we have shown and described herein the preferred embodiments of our invention, it will be apparent to those skilled in the art that many changes and modifications may be made without departing from our invention in its broader aspects. For example, the invention is not restricted to the digital values used in phase calibration being obtained by sampling the center portion of the reference signal, and the reference signal may be sampled closer to its maximum and/or minimum value in order to provide the digital values for the phase calibration. However, the center portion is desirable in the case of a sine wave, because the center portion of a sine wave has a steep slope and so the ratio of amplitude change to phase shift is large. The calibration can be performed using a single digital value provided by each A/D converter on a single cycle of the reference signal instead of accumulating several digital values over a plurality of cycles for each A/D converter and averaging the digital values. Moreover, the present invention is not restricted to apparatus including only two or four A/D converters. Therefore, the scope of the present invention should be determined only by the following claims. An example of the program used for carrying out the methods described with reference to FIGS. 7, 8 and 9 is shown in Appendix A. The program is in two parts, one corresponding to FIG. 9 and the other to FIGS. 7 and 8. This program is represented in the machine code and the corresponding assembly language for the 68000 microprocessor.

APPENDIX A

```
 1                                          name     spdpha
 2                                          global   qspdpha
 3                                          global   qcalerr
 4                                          global   qcalcnt
 5                                          global   qdifval
 6                                          global   qchkval
 7                                          global   qstads
 8                                          global   qenads
 9                                          global   qchamp
10                                          global   qamplads
11                                          global   qtrlads
12                                          global   qag08
13                                          global   qtbl6
14                                          global   qtbla
15                                          global   qtblc
16                                          global   qamp2ads
17                                          global   qphacmp
18                                          global   qphads
19                                          global   qcalads
20                                          global   qcaltbl
21                                          global   qrange
22                                          global   qinpads
23                                          global   qwaitlp
24                                          global   qcalacq
25                                          global   qphasmp
26                                          global   qminmax
27                                          section  spdpha
28                                          gen.1
29                    0          xxxx       set      scalar($)
30                    0          zzzz       set      xxxx*2-xxxx/2*2
31                    0 R                   org      zzzz
32                                qspdpha;
33  00000000 4E560000             link     a6,#0
34  00000004 48E78C04             movem.l  d5/d4/d0/a5,-(sp)
35  00000008 7E50                 moveq    #80,d7
36  0000000A 4286                 clr.l    d6
37  0000000C 3C390000
             0000        RU       move.w   qchamp,d6
38  00000012 02860000
             E000                 andi.l   #57344,d6
```

```
39   00000018  8E86                or.l      d6,d7
40   0000001A  2807                move.l    d7,d4
41   0000001C  24790000            move.l    qamplads,a2
               0000       RU
42   00000022  3484                move.w    d4,(a2)
43   00000024  24790000            move.l    qamp2ads,a2
               0000       RU
44   0000002A  34BC2051            move.w    #8273,(a2)
45   0000002E  2F3C0000            move.l    #100,-(sp)
               0064
46   00000034  4EB90000            jsr             qwaitlp
               0000       RU
47   0000003A  588F                addq.l    #4,sp
48   0000003C  24790000            move.l    qamplads,a2
               0000       RU
49   00000042  2E04                move.l    d4,d7
50   00000044  08C70000            bset      #0,d7
51   00000048  3487                move.w    d7,(a2)
52   0000004A  2F3C0000            move.l    #50,-(sp)
               0032
53   00000050  4EB90000            jsr             qwaitlp
               0000       RU
54   00000056  588F                addq.l    #4,sp
55   00000058  24790000            move.l    qcalads,a2
               0000       RU
56   0000005E  34BC0080            move.w    #128,(a2)
57   00000062  2F3C0000            move.l    #50,-(sp)
               0032
58   00000068  4EB90000            jsr             qwaitlp
               0000       RU
59   0000006E  588F                addq.l    #4,sp
60   00000070  24790000            move.l    qtrlads,a2
               0000       RU
61   00000076  34BC0107            move.w    #263,(a2)
62   0000007A  24790000            move.l    qtbl6,a2
               0000       RU
63   00000080  34BC0001            move.w    #1,(a2)
64   00000084  24790000            move.l    qtbla,a2
               0000       RU
65   0000008A  34BC00F7            move.w    #247,(a2)
66   0000008E  24790000            move.l    qtblc,a2
               0000       RU
67   00000094  34BC0001            move.w    #1,(a2)
68   00000098  42B90000            clr.l     qcalcnt
               0000       RU
69                         L1;    *line      50,      words      82
70   0000009E  2EBC0000            move.l    #476,(sp)
               01DC
71   000000A4  2F3C0000            move.l    #65473,-(sp)
               FFC1
72   000000AA  4EB90000            jsr             qcalacq
               0000       RU
73   000000B0  588F                addq.l    #4,sp
74   000000B2  4AB90000            tst.l     qcalerr
               0000       RU
75   000000B8  6708                beq.s     L3
```

| | | | | | |
|---|---|---|---|---|---|
| 76 | 000000BA | 4CDF2031 | | movem.l | (sp)+,d5/d4/d0/a5 |
| 77 | 000000BE | 4E5E | | unlk | a6 |
| 78 | 000000C0 | 4E75 | | rts | |
| 79 | | | L3; | *line | 54,    words    100 |
| 80 | 000000C2 | 24790000 | | move.l | qinpads,a2 |
| | | 0000 | RU | | |
| 81 | 000000C8 | 14BC0001 | | move.b | #1,(a2) |
| 82 | 000000CC | 24790000 | | move.l | qag08,a2 |
| | | 0000 | RU | | |
| 83 | 000000D2 | 4287 | | clr.l | d7 |
| 84 | 000000D4 | 3E12 | | move.w | (a2),d7 |
| 85 | 000000D6 | E387 | | asl.l | #1,d7 |
| 86 | 000000D8 | 06870080 | | add.l | #8454130,d7 |
| | | FFF2 | | | |
| 87 | 000000DE | 2A47 | | move.l | d7,a5 |
| 88 | 000000E0 | BAF90000 | | cmp.l | qstads+4,a5 |
| | | 0004 | RU | | |
| 89 | 000000E6 | 6406 | | bcc.s | L5 |
| 90 | 000000E8 | DBFC0000 | | add.l | #1024,a5 |
| | | 0400 | | | |
| 91 | | | L5; | *line | 58,    words    122 |
| 92 | 000000EE | 7AFF | | moveq | #-1,d5 |
| 93 | 000000F0 | 7801 | | moveq | #1,d4 |
| 94 | | | L7; | *line | 59,    words    124 |
| 95 | 000000F2 | 0C840000 | | cmpi.l | #14,d4 |
| | | 000E | | | |
| 96 | 000000F8 | 6C26 | | bge.s | L11 |
| 97 | 000000FA | BAF90000 | | cmp.l | qenads+4,a5 |
| | | 0004 | RU | | |
| 98 | 00000100 | 6608 | | bne.s | L2 |
| 99 | 00000102 | 2E390000 | | move.l | qstads+4,d7 |
| | | 0004 | RU | | |
| 100 | 00000108 | 6006 | | bra.s | L4 |
| 101 | | | L2; | | |
| 102 | 0000010A | 45ED0002 | | lea | 2(a5),a2 |
| 103 | 0000010E | 2E0A | | move.l | a2,d7 |
| 104 | | | L4; | | |
| 105 | 00000110 | 2A47 | | move.l | d7,a5 |
| 106 | 00000112 | 3E15 | | move.w | (a5),d7 |
| 107 | 00000114 | 48C7 | | ext.l | d7 |
| 108 | 00000116 | 0C470200 | | cmpi.w | #512,d7 |
| 109 | 0000011A | 6F1E | | ble.s | L71 |
| 110 | 0000011C | 7A01 | | moveq | #1,d5 |
| 111 | 0000011E | 6016 | | bra.s | L31 |
| 112 | | | L11; | *line | 68,    words    147 |
| 113 | 00000120 | 24790000 | | move.l | qinpads,a2 |
| | | 0000 | RU | | |
| 114 | 00000126 | 14BC000E | | move.b | #14,(a2) |
| 115 | 0000012A | 23FC0000 | | move.l | #480,qcalerr |
| | | 01E00000 | | | |
| | | 0000 | RU | | |
| 116 | 00000134 | 6040 | | bra.s | L6 |
| 117 | | | L31; | *line | 59,    words    158 |
| 118 | 00000136 | 5284 | | addq.l | #1,d4 |
| 119 | 00000138 | 60B8 | | bra.s | L7 |
| 120 | | | L71; | *line | 64,    words    160 |

| | | | | | |
|---|---|---|---|---|---|
| 121 | 0000013A | 0C850000 | | cmpi.l | #1,d5 |
| | | 0001 | | | |
| 122 | 00000140 | 66F4 | | bne.s | L31 |
| 123 | 00000142 | 2E8D | | move.l | a5,(sp) |
| 124 | 00000144 | 4EB90000 | | jsr | qphasmp |
| | | 0000 | RU | | |
| 125 | 0000014A | 24790000 | | move.l | qinpads,a2 |
| | | 0000 | RU | | |
| 126 | 00000150 | 14BC000E | | move.b | #14,(a2) |
| 127 | 00000154 | 2E390000 | | move.l | qcalcnt,d7 |
| | | 0000 | RU | | |
| 128 | 0000015A | E087 | | asr.l | #8,d7 |
| 129 | 0000015C | 2807 | | move.l | d7,d4 |
| 130 | 0000015E | 2E390000 | | move.l | qdifval,d7 |
| | | 0000 | RU | | |
| 131 | 00000164 | BE84 | | cmp.l | d4,d7 |
| 132 | 00000166 | 6E16 | | bgt.s | L72 |
| 133 | 00000168 | 2E390000 | | move.l | qdifval,d7 |
| | | 0000 | RU | | |
| 134 | 0000016E | 2C04 | | move.l | d4,d6 |
| 135 | 00000170 | 4486 | | neg.l | d6 |
| 136 | 00000172 | BE86 | | cmp.l | d6,d7 |
| 137 | 00000174 | 6D08 | | blt.s | L72 |
| 138 | | | L6; | | |
| 139 | 00000176 | 4CDF2031 | | movem.l | (sp)+,d5/d4/d0/a5 |
| 140 | 0000017A | 4E5E | | unlk | a6 |
| 141 | 0000017C | 4E75 | | rts | |
| 142 | | | L72; | *line | 77, words 194 |
| 143 | 0000017E | 0CB90000 | | cmpi.l | #1023,qcalcnt |
| | | 03FF0000 | | | |
| | | 0000 | RU | | |
| 144 | 00000188 | 6D0C | | blt.s | L13 |
| 145 | 0000018A | 23FC0000 | | move.l | #479,qcalerr |
| | | 01DF0000 | | | |
| | | 0000 | RU | | |
| 146 | 00000194 | 60E0 | | bra.s | L6 |
| 147 | | | L13; | *line | 81, words 206 |
| 148 | 00000196 | 4287 | | clr.l | d7 |
| 149 | 00000198 | 3E390000 | | move.w | qphacmp,d7 |
| | | 0000 | RU | | |
| 150 | 0000019E | 2C390000 | | move.l | qdifval,d6 |
| | | 0000 | RU | | |
| 151 | 000001A4 | E286 | | asr.l | #1,d6 |
| 152 | 000001A6 | DE86 | | add.l | d6,d7 |
| 153 | 000001A8 | 23C70000 | | move.l | d7,qchkval |
| | | 0000 | RU | | |
| 154 | 000001AE | 4EB90000 | | jsr | qminmax |
| | | 0000 | RU | | |
| 155 | 000001B4 | 4AB90000 | | tst.l | qcalerr |
| | | 0000 | RU | | |
| 156 | 000001BA | 670C | | beq.s | L33 |
| 157 | 000001BC | 06B90000 | | addi.l | #476,qcalerr |
| | | 01DC0000 | | | |
| | | 0000 | RU | | |
| 158 | 000001C6 | 60AE | | bra.s | L6 |
| 159 | | | L33; | *line | 87, words 231 |

```
160   000001C8  33F90000              move.w    qchkval+2,qphacmp
                00020000 RU
                0000     RU
161   C00001D2  24790000              move.l    qphads,a2
                0000     RU
162   000001D8  34B90000              move.w    qphacmp,(a2)
                0000     RU
163   000001DE  52B90000              addq.l    #1,qcalcnt
                0000     RU
164   000001E4  6000FEB8              bra                 L1
165                              ;fnsize=247
166

1                                      name     phasmp
  2                                      global   a.ldiv
  3                                      global   qphasmp
  4                                      global   qdifval
  5                                      global   qdiffa
  6                                      global   qdiffb
  7                                      global   qhigha
  8                                      global   qhighb
  9                                      global   qlowa
 10                                      global   qlowb
 11                                      global   qstads
 12                                      global   qenads
 13                                      section  phasmp
 14                                      gen.1
 15            0           xxxx          set      scalar($)
 16            0           zzzz          set      xxxx*2-xxxx/2*2
 17            0 R                       org      zzzz
 18                              qphasmp;
 19   00000000  4E56FFF8              link      a6,#-8
 20   00000004  48E79C1C              movem.l   d5/d4/d3/d0/a5/a4/a3,-(sp)
 21   00000008  2A6E0008              move.l    8(a6),a5
 22   0000000C  2E0D                  move.l    a5,d7
 23   0000000E  0687FFFF              add.l     #-65536,d7
                0000
 24   00000014  2847                  move.l    d7,a4
 25   00000016  BAF90000              cmp.l     qstads+4,a5
                0004     RU
 26   0000001C  6618                  bne.s     L1
 27   0000001E  2A390000              move.l    qenads+4,d5
                0004     RU
 28   00000024  2445                  move.l    d5,a2
 29   00000026  3E12                  move.w    (a2),d7
 30   00000028  48C7                  ext.l     d7
 31   0000002A  0687FFFF              add.l     #-512,d7
                FE00
 32   00000030  2D47FFF8              move.l    d7,-8(a6)
 33   00000034  6010                  bra.s     L3
 34                              L1;      *line     50,     words    27
 35   00000036  3E2DFFFE              move.w    -2(a5),d7
 36   0000003A  48C7                  ext.l     d7
 37   0000003C  0687FFFF              add.l     #-512,d7
                FE00
 38   00000042  2D47FFF8              move.l    d7,-8(a6)
 39                              L3;      *line     51,     words    35
```

| | | | | | |
|---|---|---|---|---|---|
| 40 | 00000046 | 2E3C0000 0200 | | move.l | #512,d7 |
| 41 | 0000004C | 3C15 | | move.w | (a5),d6 |
| 42 | 0000004E | 48C6 | | ext.l | d6 |
| 43 | 00000050 | 9E86 | | sub.l | d6,d7 |
| 44 | 00000052 | 2D47FFFC | | move.l | d7,-4(a6) |
| 45 | 00000056 | 3614 | | move.w | (a4),d3 |
| 46 | 00000058 | 48C3 | | ext.l | d3 |
| 47 | 0000005A | 0C830000 0200 | | cmpi.l | #512,d3 |
| 48 | 00000060 | 6F0A | | ble.s | L2 |
| 49 | 00000062 | 2443 | | move.l | d3,a2 |
| 50 | 00000064 | 45EAFE00 | | lea | -512(a2),a2 |
| 51 | 00000068 | 2E0A | | move.l | a2,d7 |
| 52 | 0000006A | 6008 | | bra.s | L4 |
| 53 | | | L2; | | |
| 54 | 0000006C | 2E3C0000 0200 | | move.l | #512,d7 |
| 55 | 00000072 | 9E83 | | sub.l | d3,d7 |
| 56 | | | L4; | | |
| 57 | 00000074 | 2607 | | move.l | d7,d3 |
| 58 | 00000076 | 2E2EFFF8 | | move.l | -8(a6),d7 |
| 59 | 0000007A | BEAEFFFC | | cmp.l | -4(a6),d7 |
| 60 | 0000007E | 6F16 | | ble.s | L5 |
| 61 | 00000080 | B6AEFFFC | | cmp.l | -4(a6),d3 |
| 62 | 00000084 | 6F54 | | ble.s | L31 |
| 63 | 00000086 | 264C | | move.l | a4,a3 |
| 64 | 00000088 | 45ED0006 | | lea | 6(a5),a2 |
| 65 | 0000008C | 2A0A | | move.l | a2,d5 |
| 66 | 0000008E | 45EC0008 | | lea | 8(a4),a2 |
| 67 | 00000092 | 284A | | move.l | a2,a4 |
| 68 | 00000094 | 6068 | | bra.s | L51 |
| 69 | | | L5; | *line 64, words 75 | |
| 70 | 00000096 | B6AEFFF8 | | cmp.l | -8(a6),d3 |
| 71 | 0000009A | 6F3E | | ble.s | L31 |
| 72 | 0000009C | B8F90000 0000 RU | | cmp.l | qstads,a4 |
| 73 | 000000A2 | 6608 | | bne.s | L6 |
| 74 | 000000A4 | 2E390000 0000 RU | | move.l | qenads,d7 |
| 75 | 000000AA | 6006 | | bra.s | L01 |
| 76 | | | L6; | | |
| 77 | 000000AC | 45ECFFFE | | lea | -2(a4),a2 |
| 78 | 000000B0 | 2E0A | | move.l | a2,d7 |
| 79 | | | L01; | | |
| 80 | 000000B2 | 2647 | | move.l | d7,a3 |
| 81 | 000000B4 | 45ED0004 | | lea | 4(a5),a2 |
| 82 | 000000B8 | 2A0A | | move.l | a2,d5 |
| 83 | 000000BA | 45EC0006 | | lea | 6(a4),a2 |
| 84 | 000000BE | 284A | | move.l | a2,a4 |
| 85 | 000000C0 | BAF90000 0004 RU | | cmp.l | qstads+4,a5 |
| 86 | 000000C6 | 6608 | | bne.s | L21 |
| 87 | 000000C8 | 2E390000 0004 RU | | move.l | qenads+4,d7 |
| 88 | 000000CE | 6006 | | bra.s | L41 |

```
 89                                    L21;
 90  000000D0  45EDFFFE                       lea             -2(a5),a2
 91  000000D4  2E0A                           move.l   a2,d7
 92                                    L41;
 93  000000D6  2A47                           move.l   d7,a5
 94  000000D8  6024                           bra.s    L51
 95                                    L31;    *line   73,      words   109
 96  000000DA  45EC0006                       lea              6(a4),a2
 97  000000DE  264A                           move.l   a2,a3
 98  000000E0  BAF90000                       cmp.l    qstads+4,a5
               0004      RU
 99  000000E6  6608                           bne.s    L61
100  000000E8  2E390000                       move.l   qenads+4,d7
               0004      RU
101  000000EE  6006                           bra.s    L02
102                                    L61;
103  000000F0  45EDFFFE                       lea              -2(a5),a2
104  000000F4  2E0A                           move.l   a2,d7
105                                    L02;
106  000000F6  2A07                           move.l   d7,d5
107  000000F8  45ED0006                       lea              6(a5),a2
108  000000FC  2A4A                           move.l   a2,a5
109                                    L51;    *line   78,      words   127
110  000000FE  42B90000                       clr.l    qlowb
               0000      RU
111  00000104  23F90000                       move.l   qlowb,qlowa
               00000000  RU
               0000      RU
112  0000010E  23F90000                       move.l   qlowa,qhighb
               00000000  RU
               0000      RU
113  00000118  23F90000                       move.l   qhighb,qhigha
               00000000  RU
               0000      RU
114  00000122  23F90000                       move.l   qhigha,qdiffb
               00000000  RU
               0000      RU
115  0000012C  23F90000                       move.l   qdiffb,qdiffa
               00000000  RU
               0000      RU
116  00000136  42AEFFF8                       clr.l    -8(a6)
117                                    L32;    *line   80,      words   157
118  0000013A  0CAE0000                       cmpi.l   #16,-8(a6)
               0010FFF8
119  00000142  6C0E                           bge.s    L52
120  00000144  B6F90000                       cmp.l    qenads,a3
               0000      RU
121  0000014A  6368                           bls.s    L33
122  0000014C  97FC0400                       sub.l    #1024,a3
123  00000150  6062                           bra.s    L33
124                                    L52;    *line   103,     words   170
125  00000152  2E390000                       move.l   qdiffb,d7
               0000      RU
126  00000158  9EB90000                       sub.l    qdiffa,d7
               0000      RU
127  0000015E  DEB90000                       add.l    qhighb,d7
```

```
128  00000164  9EB90000              sub.l    qhigha,d7
               0000       RU
129  0000016A  DEB90000              add.l    qlowb,d7
               0000       RU
130  00000170  9EB90000              sub.l    qlowa,d7
               0000       RU
131  00000176  23C70000              move.l   d7,qdifval
               0000       RU
132  0000017C  4AB90000              tst.l    qdifval
               0000       RU
133  00000182  6C04                  bge.s    L23
134  00000184  7EE8                  moveq    #-24,d7
135  00000186  6002                  bra.s    L43
136                      L23;
137  00000188  7E18                  moveq    #24,d7
138                      L43;
139  0000018A  2D47FFF8              move.l   d7,-8(a6)
140  0000018E  2E390000              move.l   qdifval,d7
               0000       RU
141  00000194  DEAEFFF8              add.l    -8(a6),d7
142  00000198  2E87                  move.l   d7,(sp)
143  0000019A  2F3C0000              move.l   #48,-(sp)
               0030
144  000001A0  4EB90000              jsr      a.ldiv
               0000       RU
145  000001A6  23D70000              move.l   (sp),qdifval
               0000       RU
146  000001AC  4CDF3839              movem.l  (sp)+,d5/d4/d3/d0/a5/a4/a3
147  000001B0  4E5E                  unlk     a6
148  000001B2  4E75                  rts
149                      L33;       *line    83,    words    218
150  000001B4  BAB90000              cmp.l    qenads+4,d5
               0004       RU
151  000001BA  6306                  bls.s    L53
152  000001BC  04850000              subi.l   #1024,d5
               0400
153                      L53;       *line    85,    words    225
154  000001C2  B8F90000              cmp.l    qenads,a4
               0000       RU
155  000001C8  6304                  bls.s    L73
156  000001CA  99FC0400              sub.l    #1024,a4
157                      L73;       *line    87,    words    232
158  000001CE  BAF90000              cmp.l    qenads+4,a5
               0004       RU
159  000001D4  6304                  bls.s    L14
160  000001D6  9BFC0400              sub.l    #1024,a5
161                      L14;       *line    89,    words    239
162  000001DA  3E13                  move.w   (a3),d7
163  000001DC  48C7                  ext.l    d7
164  000001DE  DFB90000              add.l    d7,qhigha
               0000       RU
165  000001E4  2445                  move.l   d5,a2
166  000001E6  3E12                  move.w   (a2),d7
167  000001E8  48C7                  ext.l    d7
168  000001EA  DFB90000              add.l    d7,qhighb
```

| | | | | | |
|---|---|---|---|---|---|
| | | 0000 | RU | | |
| 169 | 000001F0 | 3E14 | | move.w | (a4),d7 |
| 170 | 000001F2 | 48C7 | | ext.l | d7 |
| 171 | 000001F4 | DFB90000 | | add.l | d7,qdiffa |
| | | 0000 | RU | | |
| 172 | 000001FA | 3E15 | | move.w | (a5),d7 |
| 173 | 000001FC | 48C7 | | ext.l | d7 |
| 174 | 000001FE | DFB90000 | | add.l | d7,qdiffb |
| | | 0000 | RU | | |
| 175 | 00000204 | B6F90000 | | cmp.l | qenads,a3 |
| | | 0000 | RU | | |
| 176 | 0000020A | 6608 | | bne.s | L22 |
| 177 | 0000020C | 2E390000 | | move.l | qstads,d7 |
| | | 0000 | RU | | |
| 178 | 00000212 | 6006 | | bra.s | L42 |
| 179 | | | L22; | | |
| 180 | 00000214 | 45EB0002 | | lea | 2(a3),a2 |
| 181 | 00000218 | 2E0A | | move.l | a2,d7 |
| 182 | | | L42; | | |
| 183 | 0000021A | 2807 | | move.l | d7,d4 |
| 184 | 0000021C | 2444 | | move.l | d4,a2 |
| 185 | 0000021E | 3E12 | | move.w | (a2),d7 |
| 186 | 00000220 | 48C7 | | ext.l | d7 |
| 187 | 00000222 | DFB90000 | | add.l | d7,qlowa |
| | | 0000 | RU | | |
| 188 | 00000228 | BAB90000 | | cmp.l | qenads+4,d5 |
| | | 0004 | RU | | |
| 189 | 0000022E | 6608 | | bne.s | L62 |
| 190 | 00000230 | 2E390000 | | move.l | qstads+4,d7 |
| | | 0004 | RU | | |
| 191 | 00000236 | 6006 | | bra.s | L03 |
| 192 | | | L62; | | |
| 193 | 00000238 | 2445 | | move.l | d5,a2 |
| 194 | 0000023A | 548A | | addq.l | #2,a2 |
| 195 | 0000023C | 2E0A | | move.l | a2,d7 |
| 196 | | | L03; | | |
| 197 | 0000023E | 2807 | | move.l | d7,d4 |
| 198 | 00000240 | 2444 | | move.l | d4,a2 |
| 199 | 00000242 | 3E12 | | move.w | (a2),d7 |
| 200 | 00000244 | 48C7 | | ext.l | d7 |
| 201 | 00000246 | DFB90000 | | add.l | d7,qlowb |
| | | 0000 | RU | | |
| 202 | 0000024C | D7FC0000 | | add.l | #14,a3 |
| | | 000E | | | |
| 203 | 00000252 | 06850000 | | addi.l | #14,d5 |
| | | 000E | | | |
| 204 | 00000258 | D9FC0000 | | add.l | #14,a4 |
| | | 000E | | | |
| 205 | 0000025E | DBFC0000 | | add.l | #14,a5 |
| | | 000E | | | |
| 206 | 00000264 | 52AEFFF8 | | addq.l | #1,-8(a6) |
| 207 | 00000268 | 6000FED0 | | bra | L32 |
| 208 | | | ;fnsize=312 | | |
| 209 | | | | | |

We claim:

1. A method of calibrating the phase relationship of N-phase clock signals (N: an integer larger than one) for an analog-to-digital conversion apparatus including clock generation means for generating the N-phase clock signals and N analog-to-digital converters for sampling a common analog input signal in response to the N-phase clock signals respectively and converting the sampled analog input signal into a digital signal, comprising the steps of:

applying a repetitive analog reference signal to the N analog-to-digital converters in common, the analog reference signal being synchronized with the N-phase clock signals;

selecting digital values provided by said N analog-to-digital converters at corresponding sampling points of different respective cycles of the reference signal; and, if the selected digital values are different from each other, adjusting the phase relationship of the N-phase clock signals in a manner such as to reduce the difference between the selected digital values from said N analog-to-digital converters.

2. A method according to claim 1, wherein the step of selecting digital values provided by said N digital-to-analog converters comprises selecting digital values provided on N different cycles of the reference signal at corresponding levels of transitions of the same slope.

3. A method according to claim 1, wherein the period ratio of the repetitive reference signal to the clock signal is one of N:(kN+1), N:(kN−1), (kN+1):N and (nk−1):N where k is a positive integer.

4. a method according to claim 1, wherein the repetitive analog reference signal has a sinusoidal waveform.

5. A method according to claim 1, wherein the repetitive reference signal has a ramp waveform.

6. A method according to claim 5, wherein the selected digital values from said N analog-to-digital converters are the values that are closest to the center portion of the range of the repetitive reference signal.

7. A method according to claim 5, wherein the selected digital values from said N analog-to-digital converters are the values that are closest to the center portion of the range of the repetitive reference signal, values that are higher than the closest values and values that are lower than the closest values.

8. An apparatus for calibrating the phase relationship of N-phase clock signals (N: an integer larger than one) for an analog-to-digital conversion apparatus including clock generation means for generating the N-phase clock signals and N analog-to-digital converters for sampling a common analog input signal in response to the N-phase clock signals respectively and converting the sampled analog input signal into a digital signal, comprising:

reference signal generation means for generating a repetitive analog reference signal in synchronism with the clock signals and applying the reference signal to said N analog-to-digital converters in common;

phase adjustment means for adjusting the phase relationship of the N-phase clock signals; and control means for selecting digital values provided by said N analog-to-digital converters at corresponding sampling points of different respective cycles of the reference signal and, if the selected digital values are different from each other, controlling said phase adjustment means in a manner such as to reduce the difference between the selected digital values from said N analog-to-digital converters.

9. An apparatus according to claim 8, wherein the control means are operative to select digital values provided on N different cycles of the reference signal at corresponding levels of transitions of the same slope.

10. An apparatus according to claim 8, wherein the period ratio of the repetitive reference signal to the clock signal is one of N:(kN+1), N:(kN−1), (kN+1):N and (kN−1):N where k is a positive integer.

11. An apparatus according to claim 8, wherein said reference signal generation means generates a repetitive reference signal having a ramp waveform.

12. An apparatus according to claim 8, wherein said reference signal generation means generates a repetitive reference signal having a sinusoidal waveform.

13. An apparatus according to claim 8, wherein said control means selects the digital values from said N analog-to-digital converters that are closest to the center portion of the range of the repetitive reference signal.

14. An apparatus according to claim 8, wherein said control means selects the digital values from said N analog-to-digital converters that are closest to the center portion of the range of the repetitive reference signal, values that are higher than the closest values and values that are lower than the closest values.

15. An apparatus according to claim 8, wherein said phase adjustment means includes delay circuits to receive the N-phase clock signals respectively, at least one of said delay circuits being a variable delay circuit of which the delay time is controlled by said control means for adjusting the phase difference between the output clock signals from said delay circuits.

16. An apparatus according to claim 8, wherein said control means includes a microprocessor system.

17. A method of calibrating the phase relationship of N-phase clock signals (N: an integer larger than one), comprising the steps of:

applying a repetitive analog reference signal to N analog-to-digital converters in common, the repetitive analog reference signal being synchronized with the N-phase clock signals;

applying the N-phase clock signals to the N analog-to-digital converters respectively for sampling the analog reference signal and converting the sampled reference signal into a digital signal;

selecting digital values provided by said N analog-to-digital converters at corresponding sampling points of different respective cycles of the repetitive reference signal;

comparing the selected digital values with each other; and, if the selected digital values are not equal, adjusting the phase relationship of the N-phase clock signals in a manner such as to reduce the difference between the selected digital values.

18. A method according to claim 17, wherein the step of selecting digital values provided by said N digital-to-analog converters comprises selecting digital values provided on N different cycles of the reference signal at corresponding levels of transitions of the same slope.

* * * * *